(12) United States Patent
Buretea et al.

(10) Patent No.: US 7,068,898 B2
(45) Date of Patent: Jun. 27, 2006

(54) NANOCOMPOSITES

(75) Inventors: Mihai Buretea, San Francisco, CA (US); Stephen Empedocles, Mountain View, CA (US); Chunming Niu, Lexington, CA (US); Erik C. Scher, San Francisco, CA (US)

(73) Assignee: Nanosys, Inc., Palo Alto, CA (US)

( * ) Notice: Subject to any disclaimer, the term of this patent is extended or adjusted under 35 U.S.C. 154(b) by 180 days.

(21) Appl. No.: 10/656,916

(22) Filed: Sep. 4, 2003

(65) Prior Publication Data

US 2004/0095658 A1   May 20, 2004

Related U.S. Application Data

(60) Provisional application No. 60/408,722, filed on Sep. 5, 2002.

(51) Int. Cl.
*G02B 5/10* (2006.01)

(52) U.S. Cl. .......................... 385/123; 385/123; 257/40

(58) Field of Classification Search ................. 257/40; 385/123; 428/357
See application file for complete search history.

(56) References Cited

U.S. PATENT DOCUMENTS

| | | | |
|---|---|---|---|
| 4,110,123 A | 8/1978 | Goetzberger et al. | |
| 4,335,180 A | 6/1982 | Traut | |
| 5,154,973 A | 10/1992 | Imagawa et al. | |
| 5,260,957 A | 11/1993 | Hakimi et al. | |
| 5,293,050 A | 3/1994 | Chapple-Sokol et al. | |
| 5,354,707 A | 10/1994 | Chapple-Sokol et al. | |
| 5,358,775 A | 10/1994 | Horn, III | |
| 5,422,489 A | 6/1995 | Bhargava | |
| 5,505,928 A | 4/1996 | Alivisatos et al. | |
| 5,585,640 A | 12/1996 | Huston et al. | |
| 5,613,140 A | 3/1997 | Taira | |
| 5,690,807 A | 11/1997 | Clark, Jr. et al. | |
| 5,751,018 A | 5/1998 | Alivisatos et al. | |
| 5,874,134 A | 2/1999 | Rao et al. | |
| 5,897,945 A | 4/1999 | Lieber et al. | |
| 5,962,122 A | 10/1999 | Walpita et al. | |
| 5,990,479 A | 11/1999 | Weiss et al. | |
| 5,997,832 A | 12/1999 | Lieber et al. | |
| 6,036,774 A | 3/2000 | Lieber et al. | |
| 6,048,616 A | 4/2000 | Gallagher et al. | |
| 6,136,156 A | 10/2000 | El-Shall et al. | |
| 6,200,737 B1 | 3/2001 | Walt et al. | |

(Continued)

FOREIGN PATENT DOCUMENTS

GB    2023633 A    1/1980

(Continued)

OTHER PUBLICATIONS

Alivisatos (1996) "Perspectives on the Physical Chemistry of Semiconductor NanoCrystals." *J. Phys. Chem.* 100:13226-13239.

(Continued)

*Primary Examiner*—Frank G. Font
*Assistant Examiner*—Eric Wong
(74) *Attorney, Agent, or Firm*—Monicia Elrod-Erickson; Andrew L. Filler; Quine Intellectual Property Law Group P.C.

(57) ABSTRACT

This invention provides composite materials comprising nanostructures (e.g., nanowires, branched nanowires, nanotetrapods, nanocrystals, and nanoparticles). Methods and compositions for making such nanocomposites are also provided, as are articles comprising such composites. Waveguides and light concentrators comprising nanostructures (not necessarily as part of a nanocomposite) are additional features of the invention.

6 Claims, 8 Drawing Sheets

U.S. PATENT DOCUMENTS

| | | | |
|---|---|---|---|
| 6,225,198 B1 | 5/2001 | Alivisatos et al. | |
| 6,245,988 B1 | 6/2001 | Grätzel et al. | |
| 6,306,736 B1 | 10/2001 | Alivisatos et al. | |
| 6,322,901 B1 | 11/2001 | Bawendi et al. | |
| 6,323,270 B1 | 11/2001 | Ishida | |
| 6,340,822 B1 | 1/2002 | Brown et al. | |
| 6,344,271 B1 | 2/2002 | Yadav et al. | |
| 6,413,489 B1 | 7/2002 | Ying et al. | |
| 6,501,091 B1 | 12/2002 | Bawendi et al. | |
| 6,563,132 B1 * | 5/2003 | Talroze et al. | 257/40 |
| 6,741,019 B1 | 5/2004 | Filas et al. | |
| 2001/0046244 A1 | 11/2001 | Klimov et al. | |
| 2002/0052434 A1 | 5/2002 | Lichtenhan et al. | |
| 2002/0071952 A1 | 6/2002 | Bawendi et al. | |
| 2002/0130311 A1 | 9/2002 | Lieber et al. | |
| 2002/0172820 A1 * | 11/2002 | Majumdar et al. | 428/357 |
| 2002/0186921 A1 | 12/2002 | Schumacher et al. | |
| 2003/0142944 A1 | 7/2003 | Sundar et al. | |
| 2003/0226498 A1 | 12/2003 | Alivisatos et al. | |
| 2004/0026684 A1 | 2/2004 | Empedocles | |

FOREIGN PATENT DOCUMENTS

| | | |
|---|---|---|
| WO | WO 94/04497 A1 | 3/1994 |
| WO | WO 95/29924 A1 | 11/1995 |
| WO | WO 96/10282 A1 | 4/1996 |
| WO | WO 03/084292 A1 | 10/2003 |

OTHER PUBLICATIONS

Alivisatos (2000) "Naturally Aligned Nanocrystals" *Science*, 289:736.

Angles et al. (2001) "Plasticized starch/tunicin whiskers nanocomposite materials. 2. Mechanical behavior" *Macromolecules* 34, 2921-2931.

Barnham et al. (2000) "Quantum-dot concentrator and thermodynamic model for the global red-shift" *Applied Physics Letters* 76, 1197-1199.

Barnham et al. (2001) "Future applications of low dimensional structures in photovoltaics" *Electrochem. Soc. Proc.* vol. 2001-10:30.

Bjork et al. (2002) "One-dimensional steeplechase for electrons realized" *Nano Letters* 2, 86-90.

Cao et al. (2000) "Growth and properties of semiconductor core/shell nanocrystals with InAs cores" *J. Am. Chem. Soc.* 122, 9692-9702.

Chance et al. (1974) "Lifetime of an emitting molecule near a partially reflecting surface" *J. Chem. Phys.* 60:2744-2748.

Chance et al. (1974) "Lifetime of an excited molecule near a metal mirror: Energy transfer in the Eu3+/silver system" *J. Chem. Phys.* 60:2184-2185.

Chance et al. (1975) "Luminescent lifetimes near multiple interfaces: A quantitative comparison of theory and experiment" *Chem. Phys. Lett.* 33:590-592.

Chatten et al. (2001) "The Quantum dot concentrators: Theory and Results." *Proc 17th European Photovoltaic Solar Energy Conference*.

Colvin et al. (1994) "Light Emitting Diodes Made from Cadmium Selenide Nanocrystals and a Semiconducting Polymer." *Nature* 370:354-357.

Cui et al. (2000) "Doping and electrical transport in silicon nanowires" *J. Phys. Chem. B* 104, 5213-5216.

Cui et al. (2001) "Diameter-controlled synthesis of single-crystal silicon nanowires" *Appl. Phys. Lett.* 78, 2214-2216.

Dabbousi et al. (1995) "Electroluminescence from CdSe quantum-dot/polymer composites." *Appl. Phys. Lett.* 66(11):1316-1318.

Dabbousi et al. (1997) "(CdSe)ZnS core-shell quantum dots: Synthesis and characterization of a size series of highly luminescent nanocrysallites" *J. Phys. Chem. B* 101, 9463-9475.

Danek et al. (1996) "Synthesis of Luminescent Thin-Film CdSe/ZnSe Quantum Dot Composites Using CdSe Quantum Dots Passivated with an Overlayer of ZnSe." *Chem. Mater.* 8(1):173-180.

Diehl (1997) "Fraunhofer LUCOLEDs to replace lamps." *III-Vs Rev.* 10(1).

Drexhage (1970) "Influence of a dielectric interface on fluorescence decay time" *J. Lumin.* 1,2:693-701.

Duan et al. (2000) "General synthesis of compound semiconductor nanowires" *Adv. Mater.* 12, 298-302.

Dufresne et al. (1996) "New nanocomposite materials: Microcrystalline starch reinforced thermoplastic" *Macromolecules* 29, 7624-7626.

Empedocles et al. (1996) "Photoluminescence Spectroscopy of Single CdSe Nanocrystallite Quantum Dots." *Phys. Rev. Lett.* 77(18):3873-3876.

Empedocles et al. (1997) "Quantum-Confined Stark Effect in Single CdSe Nanocrystallite Quantum Dots," *Science*, 278-2114-2117.

Fattinger et al. (1984) "Optical-environment-dependent lifetimes and radiation patterns of luminescent centers in very thin films" *Journal of Luminecence* 31&32, 933-935.

Foulger et al. (2001) "Intelligent Textiles Based on Environmentally Repsonsive Fibers." *National Textile Center Annual Report: Nov. 2001*. pp. 1-10 of 10.

Goetzberger et al. (1977) "Solar Energy Conversion with Fluorescent Collectors." *Appl. Phys.* 14, 123-139.

Greenham et al. (1997) "Charge separation and transport in conjugated polymer cadmium selenide nanocrystal composites studied by photoluminescence quenching and photoconductivity." *Sythetic Metals* 84:545-546.

Greenham et al. (1996) "Charge separation and transport in conjugated polymer cadmium selenide nanocrystal composites studied by photoluminescence quenching and photoconductivity." *Physical Review B—Condensed Matter* 54-17628-17637.

Gudiksen et al. (2000) "Diameter-selective synthesis of semiconductor nanowires" *J. Am. Chem. Soc.* 122, 8801-8802.

Gudiksen et al. (2001) "Synthetic control of the diameter and length of single crystal semiconductor nanowires" *J. Phys. Chem. B* 105,4062-4064.

Gudiksen et al. (2002) "Growth of nanowire superlattice structures for nanoscale photonics and electronics" *Nature* 415, 617-620.

Guha et al. (1997) "Hybrid organic-inorganic semiconductor-based light emitting diodes." *J. Appl. Phys.* 82(8):4126-4128.

Hines et al. (1996) "Synthesis and Characterization on Strongly Luminescing ZnS-Capped CdSe Nanocrystals." *J. Phys. Chem.* 100-468-471.

Hu et al. (2001) "Linearly polarized emission from colloidal semiconductor quantum rods." *Science* 292:2060-2063.

Huynh et al. (1999) CdSe nanocrystal rods/poly(3-hexylthiophene) composite photovoltaic devices. *Advanced Materials* 11:923-927.

Huynh et al. (2002) "Hybrid Nanorod-Polymer Solar Cells" *Science* 295:2426-2427.

Jun et al. (2001) "Controlled synthesis of multi-armed CdS nanorod architectures using monosurfactant system" *J. Am. Chem. Soc.* 123, 5150-5151.

Kortan et al. (1990) "Nucleation and Growth of CdSe on ZnS Quantum Crystallite Seeds and Vice Versa, in Inverse Micelle Media." *J. Am. Chem. Soc.* 112:1327-1332.

Kuno et al. (1997) "The band edge luminescence of surface modified CdSe nanocrystallites: Probing the Luminescing state." *J. Chem. Phys.* 106(23):9869-9882.

Kunz and Lukosz (1980) "Changes in fluorescence lifetimes induced by variable optical environments" *Phys. Rev. B* 21:4814-4828.

Lawless et al. (1995) "Bifunctional Capping of CdS Nanoparticles and Bridging to TiO2." *J. Phys. Chem.* 99:10329-10335.

Lee et al. (2000) "Full color Emmission from II-VI Semiconductor Quantum Dot-Polymer composites." *Adv. Mater.* 12(15):1102-1105.

Li et al. (1994) "Improving CdS Quantum Dot Materials by the Sol-Gel Method" *SPIE Proceedings*, vol. 2288, No. 19. Abstract.

Li et al. (2001) "Band gap variation of size- and shape-controlled colloidal CdSe quantum rods" *Nanoletters* 1, 349-351.

Li et al. (2002) "Semiconductor nanorod liquid crystals" *Nano Letters* 2: 557-560.

Liu et al. (2001) "Preparation of NaFe4 P12 Nanowire-Polyaniline Composite for Themoelectric Usage" *20th International Conference on Thermoelectrics*.

Liu et al. (2001) "Sol-Gel Synthesis of Free-Standing Ferroelectric Lead Zirconate Titanate Nanoparticles" *J. Am. Chem. Soc.* 123, 4344.

Lukosz (1979) "Light emission by magnetic and electric dipoles close to a plane dielectric interface. III. Radiation patterns of dipoles with arbitrary orientation" *J. Opt. Soc. Am.* 69:1495-1503.

Lukosz (1981) "Light emission by multipole sources in thin layers. I. Radiation paterns of electric and magnetic dipoles" *J. Opt. Soc. Am.* 71,744-754.

Lukosz and Kunz (1977) "Fluorescence lifetime of magnetic and electric dipoles near a dielectic interface" *Optics Communications* 20:195-199.

Lukosz and Kunz (1977) "Light emission by magnetic and electric dipoles close to a plane interface. I. Total radiated power" *J. Opt. Soc. Am.* 67, 1607-1614.

Lukosz and Kunz (1977) "Light emission by magnetic and electric dipoles close to a plane dielectric interface. II. Radiation patterns of perpendicular oriented dipoles" *J. Opt. Soc. Am.* 67, 1615-1619.

Manna et al. (2000) "Synthesis of Soluble and Processable Rod-,Arrow-, Teardrop-, and Tetrapod-Shaped CdSe Nanocrystals" *J. Am. Chem. Soc.* 122, 12700-12706.

Manna et al. (2002) "Epitaxial growth and photochemical annealing of graded CdS/ZnS shells on colloidal CdSe nanorods" *J. Am. Chem. Soc.* 124, 7136-7145.

Matsumoto et al. (1996) "Preparation of Monodisperse CdS Nanocrystals by Size Selective Photocorrosion." *J. Phys. Chem.* 100(32):13781-13785.

Morales et al. (1998) "A laser ablation method for the synthesis of crystalline semiconductor nanowires" *Science* 279, 208-211.

Murray et al. (1993) "Synthesis and Characterization of Nearly Monodisperse CdE (E=S, Se, Te) Semiconductor Nanocrystallites" *J. Am. Chem. Soc.* 115, 8706-8715.

Nirmal et al. (1996) "Fluorescence intermittency in single Cadmium Selenide Nanocrystals." *Nature*, 383-802-804.

Ou et al. (1997) "Cadmium selenide quantum dot doping of organic-inorganic hybrid materials derived by sol-gel processing" *Proc. SPIE* vol. 3136, p. 348-357, *Sol-Gel Optics IV*, Bruce S. Dunn; John D. Mackenzie; Edward J. Pope; Helmut K. Schmidt; Masayuki Yamane; Eds.

Peng et al. (1997) "Epitaxial growth of highly luminescent CdSe/CdS core/shell nanocrystals with photostability and electronic accessibility" *J. Am. Chem. Soc.* 119, 7019-7029.

Peng et al. (2000) "Shape control of CdSe nanocrystals" *Nature* 404: 59-61.

Puntes et al. (2001) "Colloidal nanocrystal shape and size control: The case of cobalt" *Science* 291, 2115-2117.

Rolison (2000) "Flexible Synthesis of Composite Aerogels" ISA6 Aerogel Conference 2000, abstract. World Wide Web at http://www.unm.edu/edu~solgel/Dwabstracts/rolison.htm. pp. 1-2 of 2.

Scher et al. (2003) "Shape Control and Applications of Nanocrystals." *Philosophical Transactions of the Royal Society London, Series A*, 361:241-257.

Schlamp et al. (1997) "Improved efficiencies in light emitting diodes made with CdSe(CdS) core/shell type nanocrystals and a semiconducting polymer." *Journal of Applied Physics* 82:5837-5842.

Urban et al. (2002) "Synthesis of single-crystalline perovskite nanowires compound of barium titanate and strontium titanate" *J. Am. Chem. Soc.*, 124, 1186.

Weber et al. (1976) "Luminescent greenhouse collector for solar radiation" *Appl. Opt.* 15:2299-2300.

Wu et al. (2002) "Block-by-block growth of single-crystalline Si/SiGe superlattice nanowires" *Nano Letters* 2, 83-86.

Yun et al. (2002) "Ferroelectric Properties of Individual Barium Titanate Nanowires Investigated by Scanned Probe Microscopy" *Nanoletters* 2, 447.

Zhang et al. (1998) "Bismuth quantum-wire arrays fabricated by a vacuum melting and pressure injection process" *J. Mater. Res.*, vol. 13, No. 7, p. 1745.

* cited by examiner

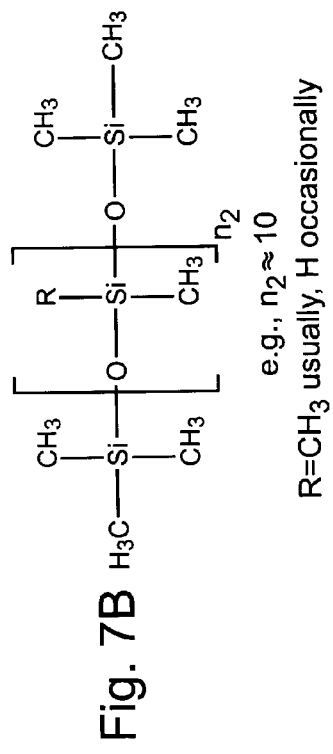
Fig. 7A
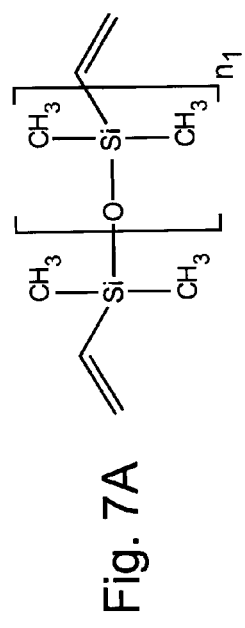
Fig. 7B
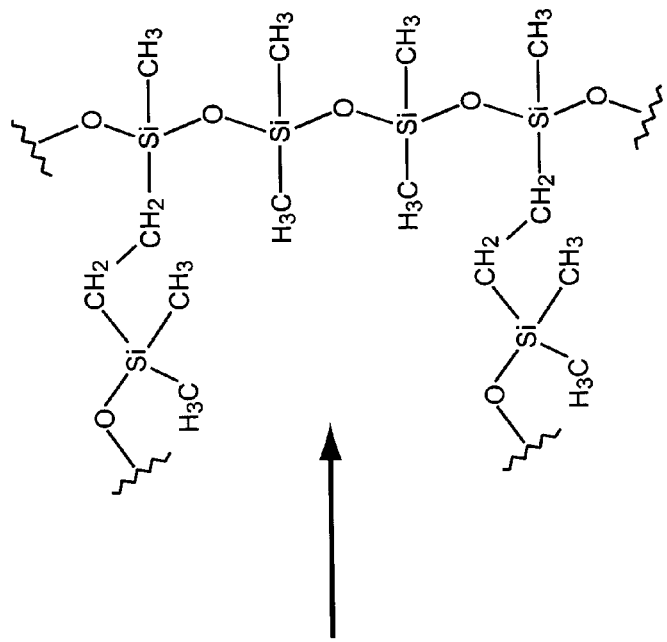
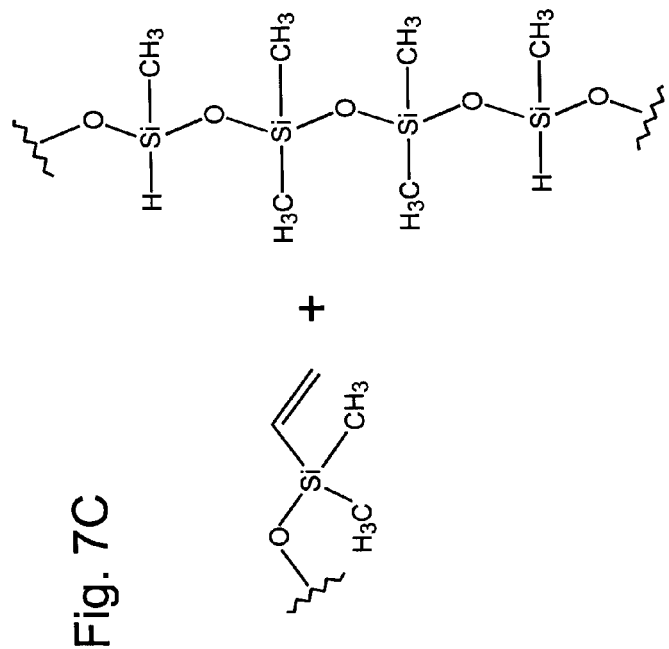
Fig. 7C

Fig. 8A
Fig. 8B
Fig. 8C
Fig. 8D

NANOCOMPOSITES

CROSS REFERENCE TO RELATED APPLICATIONS

This application claims priority to and benefit of U.S. Provisional Patent Application No. 60/408,722, filed Sep. 5, 2002, "Nanocomposites" Mihai Buretea et al., which is incorporated herein by reference in its entirety for all purposes.

FIELD OF THE INVENTION

The present invention is in the field of nanocomposites. More particularly, the invention includes composite materials comprising nanostructures (e.g., nanowires, nanorods, branched nanowires, nanotetrapods, nanocrystals, quantum dots, and nanoparticles), methods and compositions for making such composites, and articles comprising such composites. Waveguides and light concentrators comprising nanostructures that are not necessarily part of a nanocomposite are also features of the invention.

BACKGROUND OF THE INVENTION

A composite material (a composite) is formed by combining two or more materials that have different properties. The composite typically has properties different from those of its constituent materials, but within the composite the original materials can still be identified (they do not dissolve; an interface is maintained between them). Typically, one material, called the matrix, surrounds and binds together discrete units (e.g., particles, fibers, or fragments) of a second material, called the filler.

Many composite materials are currently known and widely used, for example, concrete (a composite in which the matrix is cement and the filler is aggregate), fiberglass (glass fibers in a plastic matrix), and many other types of reinforced plastics. However, there is continued demand for novel composites with desirable properties for many applications.

For example, the electronics industry utilizes materials that have high dielectric constants and that are also flexible, easy to process, and strong. Finding single component materials possessing these properties is difficult. For example, high dielectric constant ceramic materials such as ferroelectric $SrTiO_3$, $BaTiO_3$, or $CaTiO_3$ are brittle and are processed at high temperatures that are incompatible with current microcircuit manufacturing processes, while polymer materials are very easy to process but have low dielectric constants. Composite materials with micron-scale ferroelectric ceramic particles as the filler in liquid crystal polymer, fluoropolymer, or thermoplastic polymer matrices are taught in U.S. Pat. No. 5,962,122 to Walpita et al (Oct. 5, 1999) entitled "Liquid crystalline polymer composites having high dielectric constant," U.S. Pat. No. 5,358,775 to Horn et al (Oct. 25, 1994) entitled "Fluoropolymeric electrical substrate material exhibiting low thermal coefficient of dielectric constant," U.S. Pat. No. 5,154,973 to Imagawa et al (Oct. 13, 1992) entitled "Composite material for dielectric lens antennas," and U.S. Pat. No. 4,335,180 to Traut (Jun. 15, 1982) entitled "Microwave circuit boards." However, these materials do not possess ideal processing characteristics. For example, they are difficult to form into the thin uniform films used for many microelectronics applications.

Novel materials would also be useful in other industries, for example, in solar energy technology. The development of solar energy technology is primarily concerned with reducing the cost of energy conversion. This is typically achieved in one of two ways: 1) increasing the conversion efficiency of light in a solar cell without proportionately increasing its cost, or 2) increasing the size of the cell without proportionately increasing its cost. In the first case, the same number of photons hit the solar cell, but a larger number of them are converted into electricity (or the ones that are converted are converted at a higher total power). In the second, the conversion efficiency is the same, but the larger surface area means that more photons are collected per unit time. Since the sun is free, this results in improved cost efficiency. Unfortunately, at the moment neither of these strategies is effective. The complexity of increased-efficiency solar cells causes their cost to be substantially greater than the increase in performance. Similarly, larger solar panels are proportionately more expensive due to difficulties in fabricating uniform devices over large areas.

Among other aspects, the present invention provides high dielectric constant nanocomposites that overcome the processing issues noted above and solar concentrators comprising nanostructures. A complete understanding of the invention will be obtained upon review of the following.

SUMMARY OF THE INVENTION

The present invention provides nanocomposites (composite materials comprising nanostructures such as nanowires, branched nanowires, nanotetrapods, nanocrystals, and nanoparticles, for example), compositions and methods for making such nanocomposites, and articles comprising such composites.

One aspect of the invention provides waveguides and light concentrators comprising nanostructures, which in some but not all embodiments are provided as part of a nanocomposite. The nanostructures absorb light impinging on the waveguide or light concentrator and re-emit light. The nanostructures can be located and/or oriented within the waveguide or light concentrator in a manner that increases the percentage of re-emitted light that can be waveguided. For example, the nanostructures can be located and/or oriented within a light concentrator in such a manner that a greater percentage of the reemitted light is waveguided (and can thus be collected at the edge of the concentrator) than would be waveguided if emission by the collection of nanostructures were isotropic (equal in every direction).

One class of embodiments provides a waveguide comprising a cladding (e.g., a material that has a lower refractive index than the core, e.g., a lower refractive index solid, liquid, or gas, e.g., air) and a core, where the core comprises one or more nanowires or branched nanowires (e.g., nanotetrapods) and a matrix. The first and second surfaces of the core are substantially parallel so light emitted by the nanowires or branched nanowires can be efficiently waveguided by total internal reflection, and the core has a higher index of refraction than the cladding, for a similar reason. The nanowires or branched nanowires can comprise essentially any convenient material (e.g., a fluorescent material, a semiconducting material) and can comprise essentially a single material or can be heterostructures. The size of the nanostructures (e.g., the diameter and/or aspect ratio of nanowires) can be varied. In embodiments in which the core comprises a plurality of nanowires, the nanowires can be either randomly or substantially nonrandomly oriented (e.g., with a majority of the nanowires being more nearly perpendicular than parallel to a surface of the core, or with the nanowires forming a liquid crystal phase). Nonrandom orientation of the nanowires can increase the efficiency of the waveguide by increasing the percentage of light that is reemitted at angles greater than the critical angle for the particular core-cladding combination. The waveguides can be connected to a collector for collecting waveguided light, and can be used in stacks to form a multilayer light concentrator, in which the different layers comprise waveguides that can be optimized to collect light of different wavelengths.

Another class of embodiments provides a waveguide comprising a cladding (e.g., a material that has a lower refractive index than the core, e.g., a lower refractive index solid, liquid, or gas, e.g., air), a first core, and a first layer that comprises one or more nanostructures. The first layer is distributed on but is not necessarily in contact with the first core, whose first and second surfaces are substantially parallel. Some embodiments further comprise a second core. The first layer can be in direct contact with the first and/or second core(s), or can be separated from either or both, e.g., by a layer of a material whose refractive index is between that of the first layer and the core. The first layer preferably has a thickness less than about one wavelength of the light emitted by the nanostructures. The nanostructures can be nanowires, nanocrystals, or branched nanowires (e.g., nanotetrapods). The nanostructures can comprise essentially any convenient material (e.g., a fluorescent material, a semiconducting material) and can comprise essentially a single material or can be heterostructures. The size of the nanostructures (e.g., the diameter and/or aspect ratio of nanowires) can be varied. The nanostructures can be provided in various manners, e.g., as substantially pure nanostructures or as part of a nanocomposite. In embodiments in which the waveguide comprises a plurality of nanowires, the nanowires can be either randomly or substantially nonrandomly oriented (e.g., with a majority of the nanowires being more nearly perpendicular than parallel to a surface of the first core, or with the nanowires forming a liquid crystal phase). Nonrandom orientation of the nanowires can increase the efficiency of the waveguide by increasing the percentage of light that is reemitted at angles greater than the critical angle. The waveguides can be connected to a collector for collecting waveguided light, and can be used in stacks to form a multilayer light concentrator, in which the different layers comprise waveguides that can be optimized to collect light of different wavelengths.

Another aspect of the invention provides various nanocomposites. One composite material comprises a plurality of nanowires and a polymeric or small molecule or molecular matrix that is used to orient the nanowires. Another class of embodiments provides composites comprising one or more nanostructures (for example, nanowires, nanocrystals, or branched nanowires, e.g. nanotetrapods) and a polymeric matrix comprising polysiloxane (e.g., polydimethylsiloxane). The nanostructures can comprise essentially any material (e.g., a ferroelectric, fluorescent, or semiconducting material). The composite can further comprise an additive such as e.g. a surfactant or solvent. Articles comprising such composites (e.g., an LED, laser, waveguide, or amplifier) are also features of the invention.

Yet another class of embodiments provides nanocomposites comprising a small molecule or molecular matrix or a matrix comprising an organic polymer or an inorganic glass and one or more branched nanowires (e.g., nanotetrapods) or ferroelectric or semiconducting nanowires having an aspect ratio greater than about 10. The size of the nanostructures (e.g., the diameter and/or aspect ratio of nanowires) can be varied. In embodiments in which the composite comprises a plurality of nanowires, the nanowires can be either randomly or substantially nonrandomly oriented. For example, the composite can be formed into a thin film (strained or unstrained) within which a majority of the nanowires can be substantially parallel to or more nearly perpendicular than parallel to a surface of the film.

An additional class of embodiments provides composite materials comprising nanostructures and a polymeric matrix, a small molecule or molecular matrix, or a glassy or crystalline inorganic matrix where the composite is distributed on a first layer of a material that conducts substantially only electrons or substantially only holes. The composite and the first layer can be in contact or can be separated, for example, by a second layer comprising a conductive material. The first layer can be distributed on an electrode, and can be in contact with the electrode or separated from it, for example, by a third layer comprising a conductive material. The conductive material may conduct electrons or holes or both.

In another class of embodiments, the invention provides nanocomposites that support charge recombination or charge separation. These composites comprise a matrix and one or more nanostructures (e.g., nanocrystals, nanowires, branched nanowires, or nanotetrapods), where semiconducting materials comprising the matrix and/or the nanostructures have a type I or type II band offset with respect to each other.

An additional class of embodiments provides composites comprising nanostructures and a polymeric or small molecule or molecular matrix, in which the components of the matrix have an affinity for the surface of the nanostructure or for surface ligands on the nanostructures. For example, the surface ligands can each comprise a molecule found in the small molecule or molecular matrix or a derivative thereof or a monomer found in the polymeric matrix or a derivative thereof.

Another class of embodiments provides composite materials comprising one or more ferroelectric nanowires or nanoparticles and a small molecule or molecular matrix or a matrix comprising one or more polymers (e.g., an organic, inorganic, or organometallic polymer). The nanowires or nanoparticles can comprise essentially any convenient ferroelectric material, and their size (e.g., their diameter and/or aspect ratio) can be varied. The dielectric constant of the composite can be adjusted by adjusting the amount of ferroelectric nanowires or nanoparticles included in the composite. The composite (or its matrix) can further comprise an additive, for example, a surfactant, solvent, catalyst, plasticizer, antioxidant, or strengthening fiber. The composite material can be formed into a film or applied to a substrate. An additional embodiment provides a composition comprising such a composite; the composition comprises particles of the composite material, at least one solvent whose concentration can be varied, and at least one glue agent (e.g., a polymer or cross-linker). The composition can form a film, e.g., after application to a substrate.

Compositions that can be used to form a nanocomposite comprising ferroelectric nanowires or nanoparticles are another feature of the invention. In one embodiment, the composition comprises one or more ferroelectric nanowires or nanoparticles, at least one solvent, and one or more polymers. The polymers can be provided in any of a number of forms. For example, the polymer can be soluble in the solvent or can comprise oligomers soluble in the solvent, or the polymer can comprise emulsion polymerized particles. The materials and size of the nanowires and nanoparticles can be varied essentially as described above. The composition can further comprise a glue agent, cross-linking agent, surfactant, or humectant. The consistency of the composition can be controlled (e.g., by varying the solvent concentration) to make the composition suitable for use as an inkjet printing ink or screenprinting ink, or for brushing or spraying onto a surface or substrate. The composition can be used to form a film (e.g., a high dielectric nanocomposite film).

In a similar embodiment, the composition comprises one or more ferroelectric nanowires or nanoparticles, at least one solvent, and at least one monomeric precursor of at least one polymer. The materials and size of the nanowires and nanoparticles can be varied essentially as described above. The composition can further comprise a catalyst, cross-linking agent, surfactant, or humectant. The consistency of the composition can be controlled (e.g., by varying the solvent concentration) to make the composition suitable for use as an inkjet printing ink or screenprinting ink, or for brushing or spraying onto a surface or substrate. The composition can be used to form a film (e.g., a high dielectric nanocomposite film).

Methods for making the composite materials and compositions described above provide an additional feature of the invention.

DEFINITIONS

Unless defined otherwise, all technical and scientific terms used herein have the same meaning as commonly understood by one of ordinary skill in the art to which the invention pertains. The following definitions supplement those in the art and are directed to the current application and are not to be imputed to any related or unrelated case, e.g., to any commonly owned patent or application. Although any methods and materials similar or equivalent to those described herein can be used in the practice for testing of the present invention, the preferred materials and methods are described herein. Accordingly, the terminology used herein is for the purpose of describing particular embodiments only, and is not intended to be limiting.

As used in this specification and the appended claims, the singular forms "a," "an" and "the" include plural referents unless the context clearly dictates otherwise. Thus, for example, reference to "a nanostructure" includes a plurality of such nanostructures, and the like.

An "aspect ratio" is the length of a first axis of a nanostructure divided by the average of the lengths of the second and third axes of the nanostructure, where the second and third axes are the two axes whose lengths are most nearly equal each other. For example, the aspect ratio for a perfect rod would be the length of its long axis divided by the diameter of a cross-section perpendicular to (normal to) the long axis.

A "branched nanowire" is a nanostructure having three or more arms, where each arm has the characteristics of a nanowire, or a nanostructure having two or more arms, each arm having the characteristics of a nanowire and emanating from a central region that has a distinct crystal structure, e.g., having cubic symmetry, e.g., where the angle between any two arms is approximately 109.5 degrees. Examples include, but are not limited to, bipods, tripods, and nanotetrapods (tetrapods). A branched nanowire can be substantially homogenous in material properties or can be heterogeneous (a heterostructure). For example, a branched nanowire can comprise one material at the center of the branch which is a single crystal structure and a second material along the arms of the structure that is a second crystal structure, or the materials along each of the arms can differ, or the material along any single arm can change as a function of length or radius of the arm. Branched nanowires can be fabricated from essentially any convenient material or materials. Branched nanowires can comprise "pure" materials, substantially pure materials, doped materials and the like, and can include insulators, conductors, and semiconductors.

The terms "crystalline" or "substantially crystalline," when used with respect to nanostructures, refer to the fact that the nanostructures typically exhibit long-range ordering across one or more dimensions of the structure. It will be understood by one of skill in the art that the term "long range ordering" will depend on the absolute size of the specific nanostructures, as ordering for a single crystal cannot extend beyond the boundaries of the crystal. In this case, "long-range ordering" will mean substantial order across at least the majority of the dimension of the nanostructure. In some instances, a nanostructure can bear an oxide or other coating, or can be comprised of a core and at least one shell. In such instances it will be appreciated that the oxide, shell(s), or other coating need not exhibit such ordering (e.g. it can be amorphous, polycrystalline, or otherwise). In such instances, the phrase "crystalline," "substantially crystalline," "substantially monocrystalline," or "monocrystalline" refers to the central core of the nanostructure (excluding the coating layers or shells). The terms "crystalline" or "substantially crystalline" as used herein are intended to also encompass structures comprising various defects, stacking faults, atomic substitutions, and the like, as long as the structure exhibits substantial long range ordering (e.g., order over at least about 80% of the length of at least one axis of the nanostructure or its core). In addition, it will be appreciated that the interface between a core and the outside of a nanostructure or between a core and an adjacent shell or between a shell and a second adjacent shell may contain non-crystalline regions and may even be amorphous. This does not prevent the nanostructure from being crystalline or substantially crystalline as defined herein.

The "diameter of a nanocrystal" refers to the diameter of a cross-section normal to a first axis of the nanocrystal, where the first axis has the greatest difference in length with respect to the second and third axes (the second and third axes are the two axes whose lengths most nearly equal each other). The first axis is not necessarily the longest axis of the nanocrystal; e.g., for a disk-shaped nanocrystal, the cross-section would be a substantially circular cross-section normal to the short longitudinal axis of the disk. Where the cross-section is not circular, the diameter is the average of the major and minor axes of that cross-section.

The "diameter of a nanowire" refers to the diameter of a cross-section normal to the major principle axis (the long axis) of the nanowire. Where the cross-section is not circular, the diameter is the average of the major and minor axes of that cross-section.

The term "heterostructure" when used with reference to nanostructures refers to nanostructures characterized by at least two different and/or distinguishable material types. Typically, one region of the nanostructure comprises a first material type, while a second region of the nanostructure comprises a second material type. In certain embodiments, the nanostructure comprises a core of a first material and at least one shell of a second (or third etc.) material, where the different material types are distributed radially about the long axis of a nanowire, a long axis of an arm of a branched nanowire, or the center of a nanocrystal, for example. (A shell need not completely cover the adjacent materials to be considered a shell or for the nanostructure to be considered a heterostructure; for example, a nanocrystal characterized by a core of one material covered with small islands of a second material is a heterostructure.) In other embodiments, the different material types are distributed at different locations within the nanostructure; e.g., along the major (long) axis of a nanowire or along a long axis of arm of a branched nanowire. Different regions within a heterostructure can comprise entirely different materials, or the different regions can comprise a base material (e.g., silicon) having different dopants or different concentrations of the same dopant.

The term "monocrystalline" when used with respect to a nanostructure indicates that the nanostructure is substantially crystalline and comprises substantially a single crystal. When used with respect to a nanostructure heterostructure comprising a core and one or more shells, "monocrystalline" indicates that the core is substantially crystalline and comprises substantially a single crystal.

A "nanocrystal" is a nanostructure that is substantially monocrystalline. Nanocrystals typically have an aspect ratio between about 0.1 and about 1.5 (e.g., between about 0.1 and about 0.5, between about 0.5 and about 1, or between about 1 and about 1.5). Thus, nanocrystals include, for example, substantially spherical nanocrystals with aspect ratios between about 0.8 and about 1.2 and disk-shaped nanocrystals. Nanocrystals typically have a diameter between about 1.5 nm and about 15 nm (e.g., between about 2 nm and about 5 nm, between about 5 nm and about 10 nm, or between about 10 nm and about 15 nm). Nanocrystals can be substantially homogeneous in material properties, or in certain embodiments can be heterogeneous (e.g. heterostructures). In the case of nanocrystal heterostructures comprising a core and one or more shells, the core of the nanocrystal is substantially monocrystalline, but the shell(s) need not be. The nanocrystals can be fabricated from essentially any convenient material or materials. The nanocrystals can comprise "pure" materials, substantially pure materials, doped materials and the like, and can include insulators, conductors, and semiconductors.

A "nanoparticle" is any nanostructure having an aspect ratio less than about 1.5. Nanoparticles can be of any shape, and include, for example, nanocrystals, substantially spherical particles (having an aspect ratio of about 0.9 to about 1.2), and irregularly shaped particles. Nanoparticles can be amorphous, crystalline, partially crystalline, polycrystalline, or otherwise. Nanoparticles can be substantially homogeneous in material properties, or in certain embodiments can be heterogeneous (e.g. heterostructures). The nanoparticles can be fabricated from essentially any convenient material or materials. The nanoparticles can comprise "pure" materials, substantially pure materials, doped materials and the like, and can include insulators, conductors, and semiconductors.

A "nanostructure" is a structure having at least one region or characteristic dimension with a dimension of less than about 500 nm, e.g., less than about 200 nm, less than about 100 nm, less than about 50 nm, or even less than about 20 nm. Typically, the region or characteristic dimension will be along the smallest axis of the structure. Examples of such structures include nanowires, nanorods, nanotubes, branched nanowires, nanotetrapods, tripods, bipods, nanocrystals, nanodots, quantum dots, nanoparticles, and the like. Nanostructures can be substantially homogeneous in material properties, or in certain embodiments can be heterogeneous (e.g. heterostructures). The nanostructures can be fabricated from essentially any convenient material or materials. The nanostructures can comprise "pure" materials, substantially pure materials, doped materials and the like, and can include insulators, conductors, and semiconductors.

A nanostructure can optionally comprise one or more surface ligands (e.g., surfactants).

A "nanotetrapod" is a generally tetrahedral branched nanowire having four arms emanating from a central region, where the angle between any two arms is approximately 109.5 degrees.

A "nanowire" is a nanostructure that has one principle axis that is longer than the other two principle axes. Consequently, the nanowire has an aspect ratio greater than one; nanowires of this invention have an aspect ratio greater than about 1.5 or greater than about 2. Short nanowires, sometimes referred to as nanorods, typically have an aspect ratio between about 1.5 and about 10. Longer nanowires have an aspect ratio greater than about 10, greater than about 20, greater than about 50, or greater than about 100, or even greater than about 10,000. The diameter of a nanowire is typically less than about 500 nm, preferably less than about 200 nm, more preferably less than about 150 nm, and most preferably less than about 100 nm, about 50 nm, or about 25 nm, or even less than about 10 nm or about 5 nm. The nanowires of this invention can be substantially homogeneous in material properties, or in certain embodiments can be heterogeneous (e.g. nanowire heterostructures). The nanowires can be fabricated from essentially any convenient material or materials. The nanowires can comprise "pure" materials, substantially pure materials, doped materials and the like, and can include insulators, conductors, and semiconductors. Nanowires are typically substantially crystalline and/or substantially monocrystalline, but can be, e.g., polycrystalline or amorphous. Nanowires can have a variable diameter or can have a substantially uniform diameter, that is, a diameter that shows a variance less than about 20% (e.g., less than about 10%, less than about 5%, or less than about 1%) over the region of greatest variability and over a linear dimension of at least 5 nm (e.g., at least 10 nm, at least 20 nm, or at least 50 nm). Typically the diameter is evaluated away from the ends of the nanowire (e.g. over the central 20%, 40%, 50%, or 80% of the nanowire). A nanowire can be straight or can be e.g. curved or bent, over the entire length of its long axis or a portion thereof. In certain embodiments, a nanowire or a portion thereof can exhibit two- or three-dimensional quantum confinement. Nanowires according to this invention can expressly exclude carbon nanotubes, and, in certain embodiments, exclude "whiskers" or "nanowhiskers", particularly whiskers having a diameter greater than 100 nm, or greater than about 200 nm.

The phrase "substantially nonrandom" used to describe the orientation of nanowires means that the nanowires do not occupy a purely random distribution of orientations with respect to each other. A collection of nanowires is substantially nonrandomly oriented if, when the position of each nanowire is represented as a vector of unit length in a three-dimensional rectangular coordinate system, at least one component of the vector average of the nanowires' orientations is non-zero (when representing a nanowire by a vector, any intrinsic difference between the two ends of the nanowire can typically be ignored). For example, the nanowires in a collection of nanowires (e.g., the nanowires in a composite material comprising nanowires) would have substantially nonrandom orientations if a higher percentage of the nanowires pointed in one direction (or in one of at least two specific directions) than in any other direction (e.g., if at least 10%, at least 50%, at least 75%, or at least 90% of the nanowires pointed in a particular direction). As another example, nanowires in a thin film of a composite comprising nanowires would be substantially nonrandomly oriented if a majority of the nanowires had their long axes more nearly perpendicular than parallel to a surface of the film (or vice versa) (the nanowires can be substantially nonrandomly oriented yet not point in at least one specific direction). The preceding examples are for illustration only; a collection of nanowires could possess less order than these examples yet still be substantially nonrandomly oriented.

A "surface ligand" of a nanostructure is a molecule that has an affinity for and is capable of binding to at least a portion of the nanostructure's surface. Examples include various surfactants. Surface ligands or surfactants can comprise e.g. an amine, a phosphine, a phosphine oxide, a phosphonate, a phosphonite, a phosphinic acid, a phosphonic acid, a thiol, an alcohol, an amine oxide, a polymer, a monomer, an oligomer, or a siloxane.

A "type I band offset" between two semiconducting materials means that both the conduction band and the valence band of the semiconductor with the smaller bandgap are within the bandgap of the other semiconductor.

A "type II band offset" between two semiconducting materials means that either the conduction band or the valence band, but not both, of one semiconductor is within the bandgap of the other semiconductor.

BRIEF DESCRIPTION OF THE DRAWINGS

FIG. 7 depicts examples of vinyl-terminated polydimethylsiloxane oligomers (Panel A) and siloxane cross-linkers (Panel B) and illustrates the formation of cross-links between them (Panel C).

FIG. 8 schematically depicts examples of type II (Panels A and C) and type I (Panels B and D) band offsets.

DETAILED DESCRIPTION

Composite materials comprising nanostructures (nanocomposites) are provided, along with articles comprising nanocomposites and methods and compositions for making such composites.

One class of embodiments provides waveguides and light concentrators comprising nanostructures. This class of embodiments is based on the ability of certain nanostructures (e.g., nanostructures comprising a fluorescent material) to absorb and re-emit light that can then be waveguided by total internal reflection within at least one core. In many but not all embodiments, the nanostructures are provided in the form of a nanocomposite. In some embodiments, the nanostructures are substantially nonrandomly oriented to increase the efficiency of the waveguide or light concentrator.

Methods for orienting nanostructures within a composite material are discussed, including using the matrix or components thereof to orient the nanostructures. Accordingly, one aspect of the invention provides nanocomposites in which the matrix is used to orient nanowires.

The invention also provides nanocomposites comprising nanostructures and a polysiloxane matrix, as well as articles comprising such composites. Another class of embodiments provides nanocomposites comprising branched nanowires or ferroelectric or semiconducting nanowires. Yet another class of embodiments includes the use of nanocomposites with blocking layers that conduct substantially only electrons or substantially only holes. Other nanocomposites are provided that support charge recombination or charge separation (e.g., for use in luminescent or photovoltaic devices). An additional class of embodiments provides composites in which interaction between the nanostructures and the matrix is enhanced, for example, by surface ligands on the nanostructures.

One general class of embodiments provides nanocomposites that comprise ferroelectric nanowires or ferroelectric nanoparticles and that can thus possess high dielectric constants. Compositions for making such nanocomposites (e.g., compositions suitable for use as inkjet or screen printing inks) are also provided, as are methods for making all the above composites and compositions. The following sections describe the invention in more detail.

Waveguides and Light Concentrators

One aspect of the present invention provides waveguides and light concentrators (e.g., solar concentrators) comprising nanostructures. Energy (e.g., light) is absorbed and re-emitted by the nanostructures and is waveguided by total internal reflection within a core. In many embodiments, the nanostructures are provided in the form of a nanocomposite.

Dye and Quantum Dot Solar Concentrators

Figure 1:
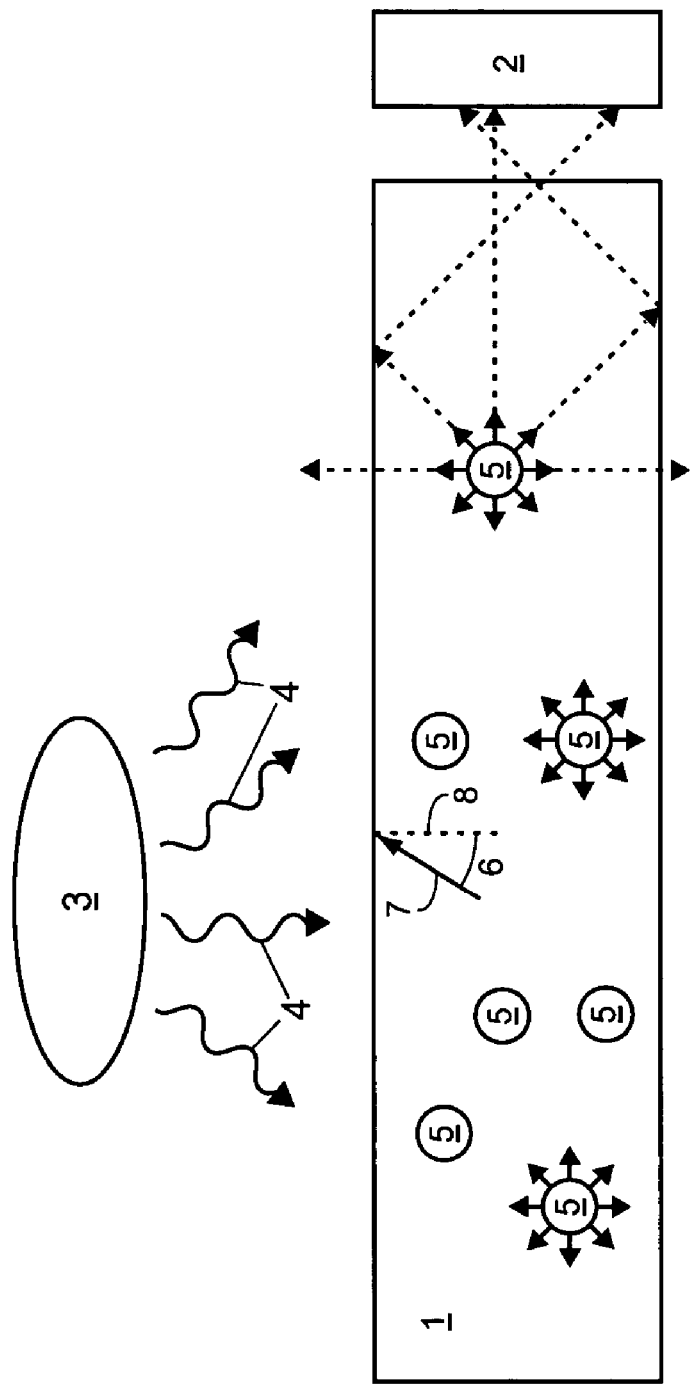
FIG. 1 schematically depicts a quantum dot solar concentrator.

As mentioned previously, typical approaches to reducing the cost of solar energy conversion are to increase the efficiency and/or size of a solar cell without proportionately increasing its cost. A different method of improving cost performance is to increase the intensity of light on a single cell. Assuming that the cell does not burn or saturate under the increased illumination, and assuming that the apparatus used to concentrate the light does not cost proportionately more than the increase in intensity, this can also produce an improvement in cost efficiency. One idea for this type of device is to take a large plastic or glass sheet and dope it with organic dye molecules that absorb and re-emit light with high efficiency. Solar concentrators of this type are described in e.g., Weber et al. (1976) *Appl. Opt.* 15, 2299 and Goetzberger et al. (1977) *Appl. Phys.* 14, 123. As illustrated in FIG. 1, light (4, squiggly arrows) impinging on the sheet 1 from a light source 3 located above the sheet is absorbed by the dye molecules (5, circles) and then re-emitted in all directions equally (isotropic emission). (Strictly speaking, most dye molecules emit light that is polarized along a single axis. In this type of solar concentrator, the individual dye molecules are isotropically oriented relative to each other within the sheet. As a result, the average emission profile of all of the dye molecules looks isotropic.) A few emitted light rays are indicated by solid arrows; continuing paths for some of these emitted rays are indicated by dashed arrows. Light that is re-emitted at angles that are greater than the critical angle for the interface between the sheet and the surrounding air is waveguided by total internal reflection and travels to the edge of the sheet before it escapes. Thus, light emitted at angles greater than the critical angle can be collected at the edge by a solar cell 2. The critical angle ($\Theta_{crit}$) for a given sheet-air interface depends on the indices of refraction of the sheet and air: $\Theta_{crit} = \sin^{-1}(n_r/n_i)$, where $n_r$ is the refractive index of air and $n_t$ is the refractive index of the sheet. As illustrated for the critical angle 6, an angle of incidence is measured between the incident ray 7 and a line 8 normal to the surface of the sheet.

By using a very large area concentrator, the intensity of the impinging light can be greatly concentrated, as represented by the equation C=S*G, where C is the ratio of light concentration collected, S is the ratio of the surface area of the sheet being illuminated by impinging light to the area of the collector at the edge of the sheet, and G represents losses in the concentrator that affect the ratio of the photons striking the surface of the concentrator to the number of photons that get guided to the edge of the sheet. In a standard concentrator, there are a number of inefficiencies that influence G. First, dye molecules only absorb a narrow band of wavelengths, and so most of the light that hits the concentrator is not absorbed, but simply passes through and is lost. This can be a substantial loss in overall efficiency. Second, dye molecules emit with finite quantum efficiency. As a result, even the photons that are absorbed do not all get re-emitted. Third, dye molecules are photo-unstable and eventually the concentrator stops working as the dye photobleaches. Finally, of the photons that are re-emitted, only those that emit at angles greater than the critical angle actually get wave guided and eventually collected. All other photons are lost. Other factors such as losses due to reabsorption or scatter within the concentrator also affect G, however, the factors above represent the major contributors to loss in this type of concentrator. As a result of these issues, solar concentrators of this type have not been implemented in a commercial product to date.

In order to improve the overall efficiency of a concentrator of the type described above, improvements in the following five characteristics are possible: 1) absorption efficiency; 2) absorption bandwidth (the breadth of the absorption spectrum); 3) quantum yield of the fluorophores in the concentrator; 4) photostability of the fluorophores in the concentrator; and 5) the angular distribution of intensities emitted from the fluorophores in the concentrator after illumination from above (the percentage of the reemitted photons have an angle greater than the critical angle and therefore get waveguided).

An improvement upon the dye molecule concentrator was made by replacing the dye molecules with quantum dots. See, e.g., Barnham et al. (2000) "Quantum-dot concentrator and thermodynamic model for the global red-shift" *Applied Physics Letters* 76, 1197–1199. Quantum dots have a number of substantial advantages over dye molecules: 1) they are extremely photostable and do not bleach, even under solar radiation; 2) they have an extremely broad absorption spectrum with extinction coefficients as much as 10 times greater than typical organic dye molecules and therefore absorb solar radiation much more efficiently than dye molecules; and 3) they can be fabricated with quantum efficiencies as high as 80%. Use of quantum dots in a solar concentrator therefore improves performance of the concentrator by improving the first four contributions to G described above (absorption efficiency, absorption bandwidth, quantum yield, and photostability). Like a collection of dye molecules, however, the collection of quantum dots emits isotropically and thus their use does not increase the percentage of emitted photons that are waveguided (the fifth contribution to G). In the case of solar concentrators comprising quantum dots, there are two effects that produce an isotropic emission profile from the collection of dots. First, for some quantum dots with a wurtzite crystal structure, the light emitted is not strictly polarized in the traditional sense, but along a 2-dimensional dipole moment oriented in the x-y plane of the nanocrystal. In other nanocrystals with a more symmetric crystal structure such as zincblend, light is emitted isotropically from the crystal in all three dimensions. Second, the quantum dots are not oriented within the sheet and therefore, even if they were polarized, they would still have an ensemble average emission profile that is isotropic. In both existing dye and quantum dot solar concentrators, it is significant that there is no consistent average orientation of the emission transition dipole to enhance collection efficiency as is described in the present invention.

In a quantum dot concentrator having quantum dots embedded in a transparent sheet surrounded by air, where the collection of dots emits light isotropically, at most $\frac{1}{2}*(\cos(\operatorname{asin}(n_1/n_2))-\cos(\text{pi}-\operatorname{asin}(n_1/n_2)))$ of the light emitted by the quantum dots can be waveguided and thus collected, where $n_1$ is the refractive index of air and $n_2$ is the refractive index of the sheet, cos is cosine, asin is arcsine, and pi is the Greek letter approximately equal to 3.14159265.

Ideas for improving the performance of a quantum dot concentrator include incorporating quantum dots with higher fluorescence quantum efficiency (e.g., greater than 30% or greater than 50%) or quantum dots with a substantially monodisperse size and/or shape distribution (see e.g., US patent application 20020071952 by Bawendi et al entitled "Preparation of nanocrystallites").

Light Concentrators

In a first general class of embodiments, the light concentrators of this invention comprise at least one core, at least one adjacent material that has a lower index of refraction than the core and that is in contact with at least a portion of a surface of the core, and a plurality of nanostructures. The nanostructures absorb light that impinges on a surface of the concentrator and re-emit light. The location of the nanostructures within the concentrator and/or the orientation of the nanostructures is controlled such that the fraction of the light emitted by the nanostructures that is waveguided by the core or cores is greater than $\frac{1}{2}*(\cos(\operatorname{asin}(n_1/n_2))-\cos(\text{pi}-\operatorname{asin}(n_1/n_2)))$, where $n_1$ is the refractive index of the adjacent material and $n_2$ is the refractive index of the core. (This fraction represents the amount of light that would be emitted at angles greater than the critical angle for a particular dielectric interface if the population of emitters were located within the core and were collectively emitting isotropically.) Preferably at least 1%, more preferably at least 10%, or most preferably at least 50% of the total nanostructures in the concentrator are located or oriented such that greater than $\frac{1}{2}*(\cos(\operatorname{asin}(n_1/n_2))-\cos(\text{pi}-\operatorname{asin}(n_1/n_2)))$, where $n_1$ is the refractive index of the adjacent material and $n_2$ is the refractive index of the core, of the light emitted by the nanostructures is waveguided by the core(s). At least one collector for collecting the waveguided light is operably connected to the core, e.g., to an edge of the core. Any type of collector can be used for collecting the light and/or measuring its intensity, for example, a detector, fiber optic cable, photocell, or solar cell. Optionally, any edges or portions of an edge of the core not occupied by the collector can be mirrored or silvered, so the waveguided light does not escape through these regions and decrease the efficiency of the concentrator. The adjacent material can be e.g., a cladding, a first layer comprising the nanostructures, or a layer of any low refractive index material.

The location of the nanostructures within the concentrator can be controlled. For example, the nanostructures can be located within the core or can be outside the core, e.g., in the material adjacent to the core. Alternatively or in addition, the orientation of the nanostructures can be controlled. For example, the light concentrator can comprise any nanostructures that have a definable unique axis of symmetry (e.g. a unique crystal axis such as the c-axis of a wurtzite nanocrystal, the elongated axis of a nanowire, or the long axis along the arm of a nanotetrapod). Placement of such nanostructures with a substantially non-random distribution of orientations of the unique axis e.g., relative to a surface of the concentrator or each other, can increase the amount of light collected by the concentrator. For example, a vector average of the orientation of the nanostructures' unique axis can have a nonzero component perpendicular to a surface of the concentrator. As one example, a plurality of substantially spherical nanocrystals (having an aspect ratio between about 0.8 and about 1.2) that have a wurtzite crystal structure can have a substantially non-random distribution of the c-axis of each wurtzite crystal and thus increase the percentage of light that is reemitted at angles greater than the critical angle, e.g. for a particular core-cladding combination.

In one embodiment, the light concentrator comprises at least one core, a cladding having a lower index of refraction than the core, and a plurality of nanowires that are located inside the core. The nanowires inside the core are substantially nonrandomly oriented in such a manner that, if a three-dimensional rectangular coordinate system is imposed on the core and the position of each nanowire is represented by a vector of unit length, the vector average of the nanowires' orientations has a nonzero component perpendicular to a surface of the core. This results in greater than $\frac{1}{2}*(\cos(\mathrm{asin}(n_1/n_2))-)\cos(\mathrm{pi}-\mathrm{asin}(n_1/n_2)))$, where $n_1$ is the refractive index of the cladding and $n_2$ is the refractive index of the core, of any light re-emitted by the nanowires being waveguided by the core, as the following description will make clear.

Nanowires absorb light isotropically, but, unlike quantum dots, they re-emit light in a non-isotropic pattern defined by a radiating dipole oriented along the long axis of the nanowire. As a result, most of the fluorescence for a given nanowire is emitted in a direction perpendicular to the long axis of the nanowire. This is different than the case for fluorescent dye molecules and for quantum dots, which is one of the reasons why the present invention is so unique. In the case of dye molecules, while emission from a single molecule is non-isotropic, defined by a radiating dipole, the absorption is also non-isotropic, with an absorption dipole typically oriented substantially parallel (but not always exactly parallel) to the emission dipole. Quantum dots, on the other hand, have isotropic absorption and emission (or isotropic absorption and 2-dimensional emission). In both of these cases, there is very inefficient light collection by the concentrator. For dye molecules, the molecules that absorb light are those whose excitation dipole are oriented more parallel to the waveguide surface than perpendicular. These molecules, which typically have an emission dipole that is oriented in substantially the same direction as the excitation dipole, will then re-emit more strongly in a direction perpendicular to the waveguide than parallel. As a result, the light is not efficiently waveguided. In the case of quantum dots, all quantum dots absorb light, but there is no orientation that directs light efficiently parallel to the waveguide (at best, one of the two dipoles in the 2D transition dipole will be oriented to emit within the plane while the other emits out of the plane. As a result, efficient collection is not achieved.

Because light emission by a single nanowire is non-isotropic, if the nanowires in a collection of nanowires (e.g., in a core) are randomly oriented, emission by the collection of nanowires is isotropic, but if the nanowires are nonrandomly oriented, emission by the collection is non-isotropic. In the example of nanowires in a waveguide core, the greater the percentage of nanowires that have a component of their long axis oriented perpendicular to the surface of the core is, or the greater the component of the vector average of the nanowires' orientations perpendicular to the surface is, the greater the percentage of light reemitted at angles greater than the critical angle and thus waveguided by the core is.

Thus, preferably at least 1%, more preferably at least 10%, or most preferably at least 50% of all the nanowires within the core are substantially nonrandomly oriented, in a direction perpendicular to the surface of the core. Optionally, at least one collector for collecting the waveguided light (e.g., a detector, fiber optic cable, photocell, or solar cell) is operably connected to the core, e.g., to at least one edge of the core.

In another embodiment, the light concentrator comprises at least one core and a first layer comprising one or more nanostructures disposed on a surface of the core. The nanostructures absorb light that impinges on a surface of the concentrator and re-emit light, and greater than $\frac{1}{2}*(\cos(\mathrm{asin}(n_1/n_2))-\cos(\mathrm{pi}-\mathrm{asin}(n_1/n_2)))$, where $n_1$ is the refractive index of the first layer and $n_2$ is the refractive index of the core, of the re-emitted light is waveguided by the core(s).

As described in e.g. Lukosz (1981) "Light emission by multipole sources in thin layers. I. Radiation patterns of electric and magnetic dipoles" *J. Opt. Soc. Am.* 71,744–754; Lukosz et al. (1977) "Light emission by magnetic and electric dipoles close to a plane dielectric interface. II. Radiation patterns of perpendicular oriented dipoles" *J. Opt. Soc. Am.* 67, 1615–1619; Lukosz (1979) "Light emission by magnetic and electric dipoles close to a plane dielectric interface. III. Radiation patterns of dipoles with arbitrary orientation" *J. Opt. Soc. Am.* 69, 1495–1503; Fattinger et al. (1984) "Optical-environment-dependent lifetimes and radiation patterns of luminescent centers in very thin films" *Journal of Luminescence* 31&32, 933–935; Lukosz and Kunz (1977) "Light emission by magnetic and electric dipoles close to a plane interface". I. "Total radiated power" *J. Opt. Soc. Am.* 67, 1607–1614; Lukosz and Kunz (1977) "Fluorescence lifetime of magnetic and electric dipoles near a dielectric interface" *Optics Communications* 20:195–199; Chance et al. (1975) "Luminescent lifetimes near multiple interfaces: A quantitative comparison of theory and experiment" *Chem. Phys. Lett.* 33:590–592; Lukosz and Kunz (1980) "Changes in fluorescence lifetimes induced by variable optical environments" *Phys. Rev. B* 21:4814–4828; Chance et al. (1974) "Lifetime of an emitting molecule near a partially reflecting surface" *J. Chem. Phys.* 60:2744–2748; Drexhage (1970) "Influence of a dielectric interface on fluorescence decay time" *J. Lumin.* 1,2:693–701; and Chance et al. (1974) "Lifetime of an excited molecule near a metal mirror: Energy transfer in the $Eu^{3+}$/silver system" *J. Chem. Phys.* 60:2184–2185, a radiating dipole located on or near a dielectric interface (an interface between two materials having different refractive indices) emits most of its light into the higher index material. Of particular importance, the light is emitted into the higher index material at angles greater than the critical angle for that interface. Additionally, if the dipole is oriented at an angle substantially normal to the dielectric interface, an even greater percentage of the light is emitted beyond the critical angle.

Thus, in a preferred embodiment, the light concentrator comprises a first layer comprising a plurality of nanowires disposed on a surface of the core and substantially nonrandomly oriented such that a vector average of the nanowires' orientations has a nonzero component perpendicular to the surface of the core. Preferably at least 1%, more preferably at least 10%, and most preferably at least 50% of all the nanowires on the core are substantially nonrandomly oriented in this manner, since the greater the degree of orientation perpendicular to the surface of the core, the greater the efficiency of capture of the re-emitted light.

In another embodiment, the nanowires need not be oriented (the nanowires are randomly oriented). In still other embodiments, the first layer can comprise nanostructures other than nanowires, for example, branched nanowires (e.g., nanotetrapods, tripods, or bipods) or nanocrystals (e.g., quantum dots). These nanostructures can be randomly or nonrandomly oriented. Optionally, at least one collector for collecting the waveguided light (e.g., a detector, fiber optic cable, photocell, or solar cell) is operably connected to the core, e.g., to at least one edge of the core.

In all of the above embodiments, the light concentrators or layers thereof (e.g., the core(s), the first layer) can be e.g. either two dimensional or one dimensional. In the example of a two dimensional core, the core is substantially larger than necessary to support a single optical mode at the wavelength that is re-emitted by the nanostructures in the concentrator in more than one dimension. In the example of a one dimensional core, the core can support only a single mode in two of three dimensions. In the one dimensional case, any other layers in the concentrator can be e.g. placed on a single surface or e.g. the layers can be created concentrically around a central layer (as is the case for an optical fiber). In this example, the central layer can be either the core or e.g. an adjacent material, a cladding, or a first layer. Remaining layers are then built from the inside out.

Nanowires in the Core

One embodiment provides a waveguide that comprises a cladding and a core. The core comprises one or more nanowires, or one or more branched nanowires, and a matrix (the core comprises a nanocomposite). The first and second surfaces of the core are substantially parallel to each other, permitting the core to act as an efficient waveguide. The core has a higher index of refraction (refractive index) than the cladding, and is in contact with the cladding over at least a majority of its first and second surfaces.

The cladding comprises a material that has a lower refractive index than the core, e.g., a lower refractive index solid, liquid, or gas, e.g., air, a low index plastic or polymer film or sheet, or any other convenient material having a smaller index of refraction than the core. It will be noted that the cladding need not be a single substance; the cladding in contact with the first surface of the core can comprise a different material than the cladding in contact with the second surface, for example.

As stated above, the refractive index of the core must be greater than that of the cladding. The larger the index difference at a dielectric interface, the smaller the critical angle for that interface and the larger the number of re-emitted photons that can be waveguided by total internal reflection and collected. This means the use of high index cores is advantageous. For example, the core can have an index of refraction greater than about 1.35, greater than about 2.5, greater than about 3.3, or even greater than 4. Preferably, the core has an index of refraction between about 1.35 and about 4.

To optimize the number of photons that can be waveguided and collected, the matrix of the core is preferentially substantially nonabsorbing and nonscattering with respect to light at wavelengths absorbed and emitted by the nanowires or branched nanowires in the core. For a waveguide for use in a solar concentrator, for example, the matrix is preferably substantially nonabsorbing and nonscattering to light in the visible, near-infrared, and infrared range, and thus is preferably substantially nonabsorbing and nonscattering with respect to wavelengths greater than about 300 nm (e.g., greater than about 300 or 400 nm and less than about 10 or 20 micrometers). In some instances, a physical property of the matrix such as e.g. its mechanical strength can be another criterion used to select an appropriate matrix material, since in some embodiments the waveguide (and typically also the core) is a flat sheet, which can be of considerable size. (As will be evident, weaker materials can still be formed into large sheets, e.g. with the provision of suitable physical support.)

The matrix can comprise e.g. a glass, a polymer, an organic polymer, an inorganic polymer, an organometallic polymer, a small molecule or molecular matrix, a gel, a liquid, a crystal, a polycrystal, or a mesoporous matrix; a number of these are known (e.g., the example polymers, glasses, and small molecules mentioned and/or referenced herein). Example materials include but are not limited to acrylic and poly(methyl methacrylate); a large number of other suitable materials are known in the art.

Either nanowires or branched nanowires (or a mixture thereof) can be used in the core. The branched nanowires can be nanotetrapods, or alternatively can be other branched structures (e.g., tripods or bipods). As described below, the diameter of the nanowires can be varied, for example, to control the wavelengths emitted by the nanowires. In certain embodiments, the waveguides comprise nanowires having an average diameter between about 2 nm and about 100 nm (e.g., between about 2 nm and about 50 nm, or between about 2 nm and about 20 nm). Nanowires with shorter aspect ratios are typically preferred, so in some embodiments the nanowires have an aspect ratio between about 1.5 and about 100, e.g. between about 5 and about 30.

In some embodiments, the waveguide core comprises a plurality of nanowires, which can be either randomly or substantially nonrandomly oriented. In a preferred embodiment, the orientation of the nanowires is substantially non-random, with the vector average of the nanowires' orientations having a nonzero component perpendicular to the first surface of the core. Preferably at least 1%, more preferably at least 10%, and most preferably at least 50% of all the nanowires in the core are substantially nonrandomly oriented in this manner, since the greater the degree of orientation perpendicular to the surface of the core, the greater the efficiency of capture of the re-emitted light. In one embodiment, a majority of the nanowires each has its long axis oriented more nearly perpendicular to than parallel to a surface of the core. In one specific embodiment, the nanowires within the core form a liquid crystal phase, in which each nanowire has its long axis oriented substantially perpendicular to a surface of the core. The use of such a liquid crystal phase results in a material that absorbs light from substantially all directions strongly but emits light primarily at angles inside the plane of the array.

Figure 2:
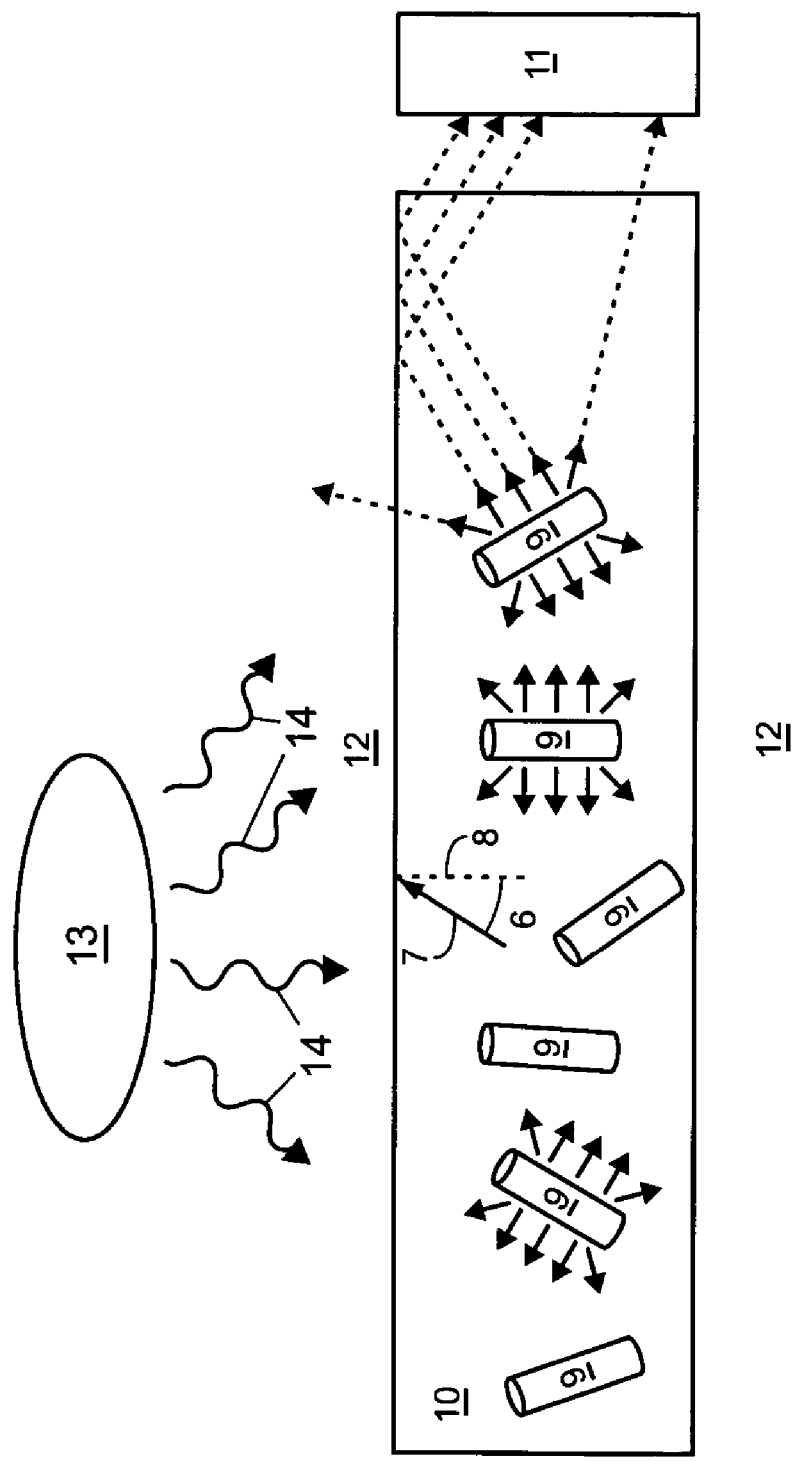
FIG. 2 schematically illustrates a waveguide in which the core comprises substantially nonrandomly oriented nanowires.

FIG. 2 illustrates an example of a waveguide in which the core 10 comprises substantially nonrandomly oriented nanowires (9, cylinders). The nanowires absorb light (14, squiggly arrows) impinging on the waveguide from a light source 13 and re-emit light. A few rays of re-emitted light are indicated by solid arrows; continuing paths for some of these emitted rays are indicated by dashed arrows. Light that is re-emitted at angles that are greater than the critical angle 6 for the interface between the core and the cladding 12 (air in this example) is waveguided by total internal reflection and travels to the edge of the core before it escapes. Thus, light emitted at angles greater than the critical angle can be collected at the edge by a collector 11. The critical angle ($\Theta_{crit}$) for a given core-cladding interface depends on the indices of refraction of the core and the cladding: $\Theta_{crit}=\sin^{-1}(n_r/n_t)$, where $n_r$ is the refractive index of the cladding and $n_t$ is the refractive index of the core. Use of this type of waveguide in a solar concentrator results in a concentrator benefiting from all the improvements of a quantum dot solar concentrator but also possessing greater efficiency, since a greater percentage of the re-emitted light is emitted at angles greater than the critical angle for total internal reflection than in a quantum dot concentrator (in the nanowire concentrator, performance is improved by improving all five contributions to G).

In a preferred embodiment, the waveguide core comprises a plurality of nanowires that absorb light impinging on a surface of the core and emit light. The nanowires are oriented in the core in such a manner that a majority of the emitted light is emitted an angle greater than the critical angle for the specific core-cladding combination. A majority of the emitted light is thus waveguided and directed toward at least one edge of the core. This type of waveguide can be an efficient light concentrator, since the waveguide can absorb light over a large surface area and direct it to an edge which has a much smaller area.

The one or more nanowires or branched nanowires can be fabricated from essentially any convenient material. For example, the nanowires or branched nanowires can comprise a semiconducting material, for example a material comprising a first element selected from group 2 or from group 12 of the periodic table and a second element selected from group 16 (e.g., ZnS, ZnSe, ZnTe, CdS, CdSe, CdTe, HgS, HgSe, HgTe, MgS, MgSe, MgTe, CaS, CaSe, CaTe, SrS, SrSe, SrTe, BaS, BaSe, BaTe, and like materials); a material comprising a first element selected from group 13 and a second element selected from group 15 (e.g., GaN, GaP, GaAs, GaSb, InN, InP, InAs, InSb, and like materials); a material comprising a group 14 element (Ge, Si, and like materials); a material such as PbS, PbSe, PbTe, AlS, AlP, and AlSb; or an alloy or a mixture thereof. Reference to the groups of the periodic table of the elements is to the new IUPAC system for numbering element groups, as set forth in the Handbook of Chemistry and Physics, 80th Edition (CRC Press, 2000). For use in an optical waveguide or light concentrator, the nanowires or branched nanowires preferably comprise a fluorescent material, more preferably one with a high quantum yield (e.g., a quantum yield greater than about 5%, 10%, 20%, 50%, or 75%). For nanowires or branched nanowires absorbing light with wavelengths between 300 and 3000 nm, the nanowires or branched nanowires can comprise one or more materials having a band-gap energy between about 0.4 eV and about 4.1 eV.

Each nanowire or branched nanowire can comprise a single material or can be a heterostructure comprising at least two different and/or distinguishable materials. The two or more materials can be entirely different (e.g., can have different chemical compositions), or they can comprise the same base material but have different dopants or different concentrations of the same dopant. The different materials can be distributed at different locations along the long axis of the nanowire or along the long axis of an arm of the branched nanowire, or different arms of the branched nanowire can comprise different materials. Alternatively, the heterostructures can be core-shell heterostructures, in which a nanowire or branched nanowire comprises a core of a first material and at least one shell of a second (or third etc.) material, where the materials are distributed radially about the long axis of the nanowire or the long axis of an arm of the branched nanowire. Suitable materials for a fluorescence efficiency-enhancing shell include e.g. materials having a higher band gap energy than the material forming the nanostructure's core. In addition to having a band gap energy greater than that of the core material, suitable materials for the shell can have e.g. good conduction and valence band offset with respect to the core material. That is, the conduction band is preferably higher and the valence band is preferably lower than those of the core material. For cores that emit energy in the visible range (e.g., CdS, CdSe, CdTe, ZnSe, ZnTe, GaP, GaAs) or near-infrared (e.g., InP, InAs, InSb, PbS, PbSe), a material that has a band gap energy e.g. in the ultraviolet range can be used (e.g., ZnS, GaN, and magnesium chalcogenides, e.g., MgS, MgSe, and MgTe). For a core that emits in the near-infrared, materials having a band gap energy e.g. in the visible range (e.g. CdS or CdSe) can also be used.

In all embodiments, at least one collector for collecting the waveguided light (e.g., a detector, fiber optic cable, photocell, or solar cell) is optionally operably connected to at least one edge of the core. Optionally, any edges or portions of an edge of the core not occupied by the collector can be mirrored or silvered.

Any of the embodiments described above can be used to form multilayer tandem light concentrators, in which different wavelengths (or different single bands of wavelengths) are collected in different layers and waveguided, e.g., to photocells or solar cells optimized for these specific wavelengths. (As one example, one layer can concentrate near ultraviolet-low wavelength visible light, another layer can concentrate visible-near infrared light, and a third layer can concentrate near infrared-infrared light.) Such a multilayer light concentrator comprises a stack of two or more waveguides as described above. It will be noted that there need be no physical distinction or delineation between the cladding of successive waveguides in such a stack, as long as the cladding has an index of refraction that is less than the index of refraction of each of the cores. The order of the waveguides within the stack is preferably such that the waveguide comprising the nanowires or branched nanowires absorbing the shortest wavelength light (having the highest band-gap) is located closest to the light source (e.g., the sun) and the waveguide comprising the nanowires or branched nanowires absorbing the longest wavelength light (having the smallest band-gap) is located farthest from the light source.

Nanostructures Outside the Core

One general class of embodiments is based on the observation, described in e.g. Lukosz (1981) "Light emission by multipole sources in thin layers. I. Radiation patterns of electric and magnetic dipoles" *J. Opt. Soc. Am.* 71,744–754; Lukosz et al. (1977) "Light emission by magnetic and electric dipoles close to a plane dielectric interface. II. Radiation patterns of perpendicular oriented dipoles" *J. Opt. Soc. Am.* 67, 1615–1619; Lukosz (1979) "Light emission by magnetic and electric dipoles close to a plane dielectric interface. III. Radiation patterns of dipoles with arbitrary orientation" *J. Opt. Soc. Am.* 69, 1495–1503; Fattinger et al. (1984) "Optical-environment-dependent lifetimes and radiation patterns of luminescent centers in very thin films" *Journal of Luminescence* 31&32, 933–935; Lukosz and Kunz (1977) "Light emission by magnetic and electric dipoles close to a plane interface. I. Total radiated power" *J. Opt. Soc. Am.* 67, 1607–1614; Lukosz and Kunz (1977) "Fluorescence lifetime of magnetic and electric dipoles near a dielectric interface" *Optics Communications* 20:195–199;

Chance et al. (1975) "Luminescent lifetimes near multiple interfaces: A quantitative comparison of theory and experiment" *Chem. Phys. Lett.* 33:590–592; Lukosz and Kunz (1980) "Changes in fluorescence lifetimes induced by variable optical environments" *Phys. Rev. B* 21:4814–4828; Chance et al. (1974) "Lifetime of an emitting molecule near a partially reflecting surface" *J. Chem. Phys.* 60:2744–2748; Drexhage (1970) "Influence of a dielectric interface on fluorescence decay time" *J. Lumin.* 1,2:693–701; and Chance et al. (1974) "Lifetime of an excited molecule near a metal mirror: Energy transfer in the $Eu^{3+}$/silver system" *J. Chem. Phys.* 60:2184–2185, that a radiating dipole located on or near a dielectric interface emits most of its light into the higher index material at angles greater than the critical angle for that interface. Additionally, if the dipole is oriented at an angle substantially normal to the dielectric interface, an even greater percentage of the light is emitted beyond the critical angle.

This class of embodiments provides a waveguide that comprises a cladding, a first core, and a first layer comprising one or more nanostructures. The one or more nanostructures can be nanowires, branched nanowires (e.g., nanotetrapods, tripods, or bipods), or nanocrystals. The first and second surfaces of the first core are substantially parallel to each other, permitting the core to act as an efficient waveguide. The first layer is distributed on the first surface of the first core, but the core and the layer are not necessarily in contact with each other. The cladding has a first portion distributed on the second surface of the first core and a second portion distributed on the first surface of the first layer, but the cladding is not necessarily in direct contact with these surfaces.

Figure 3:
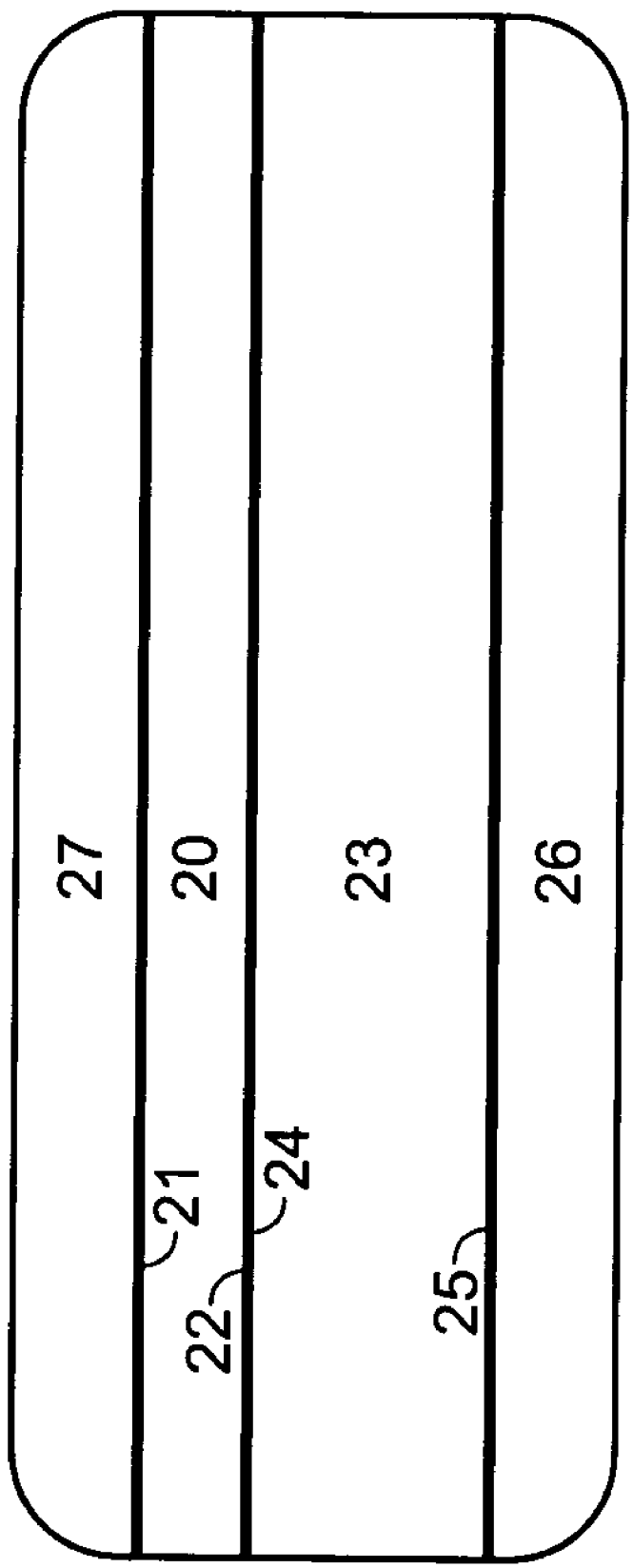
FIG. 3 schematically depicts a waveguide comprising a first core and a first layer in contact with each other.

In one embodiment, shown schematically in FIG. 3, the second portion of cladding 27 is in contact with at least a majority of first surface 21 of first layer 20, second surface 22 of the first layer is in contact with at least a majority of first surface 24 of first core 23, and at least a majority of second surface 25 of the first core is in contact with first portion of cladding 26. In this embodiment, the cladding typically has a refractive index less than the refractive index of the core. In a preferred embodiment, the one or more nanostructures absorb light impinging on the top or bottom surface of the waveguide and emit light, and a majority of the emitted light is emitted into the first core at an angle greater than the critical angle for the specific core-first layer combination. A majority of the emitted light is thus waveguided and directed toward at least one edge of the core. This type of waveguide can be an efficient light concentrator, since the waveguide can absorb light essentially isotropically over a large surface area and direct it to an edge which has a much smaller area.

Alternatively, the first layer and the first core can be separated, e.g., by a layer of a material having a refractive index between that of the first layer and first core.

Figure 4:
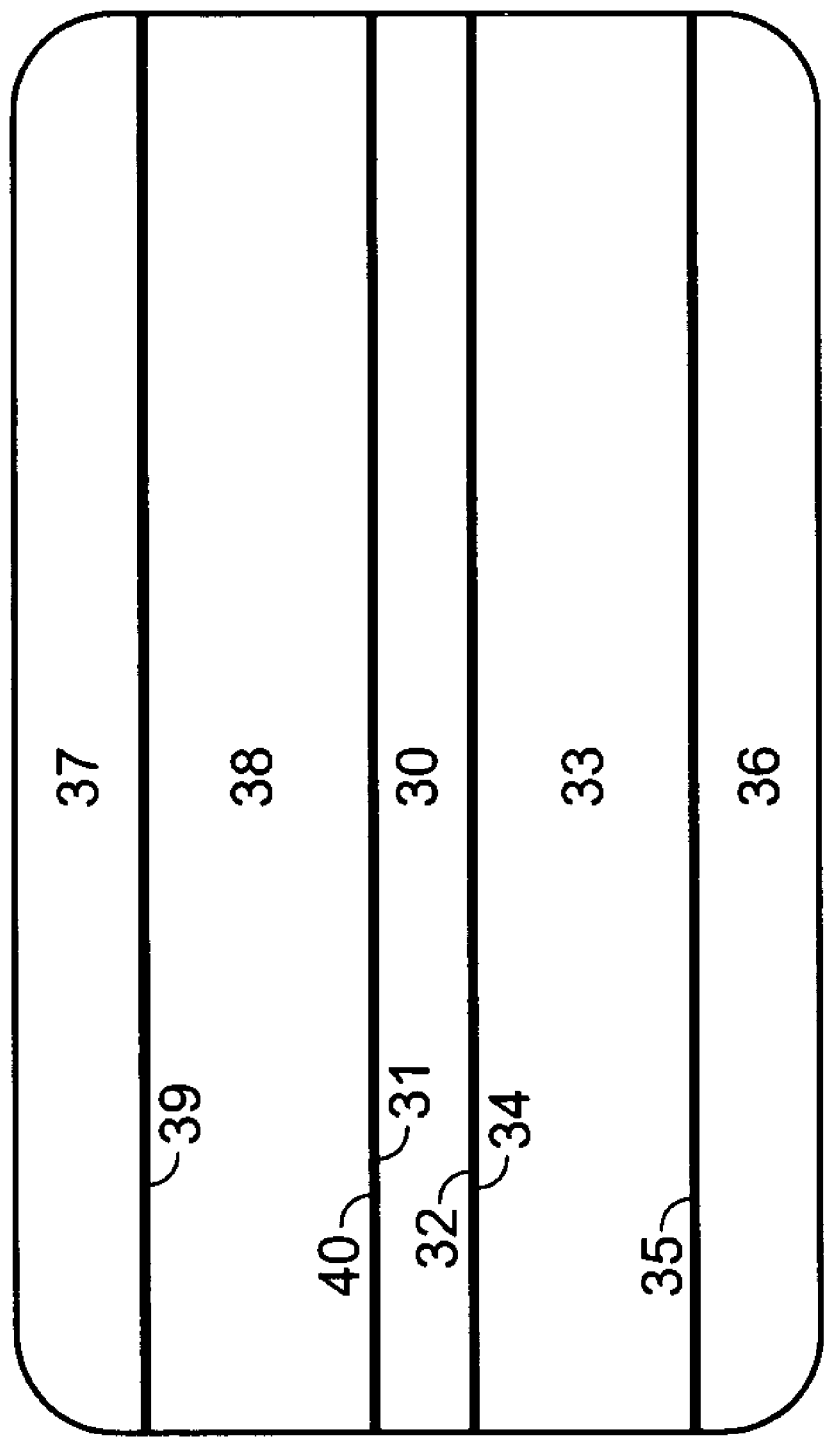
FIG. 4 schematically depicts a waveguide comprising a first layer in contact with two cores.

In other embodiments, the waveguide further comprises a second core. The second core has two substantially parallel surfaces and is located between, but is not necessarily in contact with, the first layer and the second portion of the cladding. Typically, the first and second cores comprise the same material, although they can be formed of different materials. In one specific embodiment, shown schematically in FIG. 4, the second portion of the cladding 37 is in contact with the top surface 39 of the second core 38, the bottom surface 40 of the second core is in contact with the first surface 31 of the first layer 30, the second surface 32 of the first layer is in contact with the first surface 34 of the first core 33, and the second surface 35 of the first core is in contact with the first portion of the cladding 36. In this embodiment, the first layer and the cladding portions each have a refractive index less than that of the first and second cores.

Figure 5:
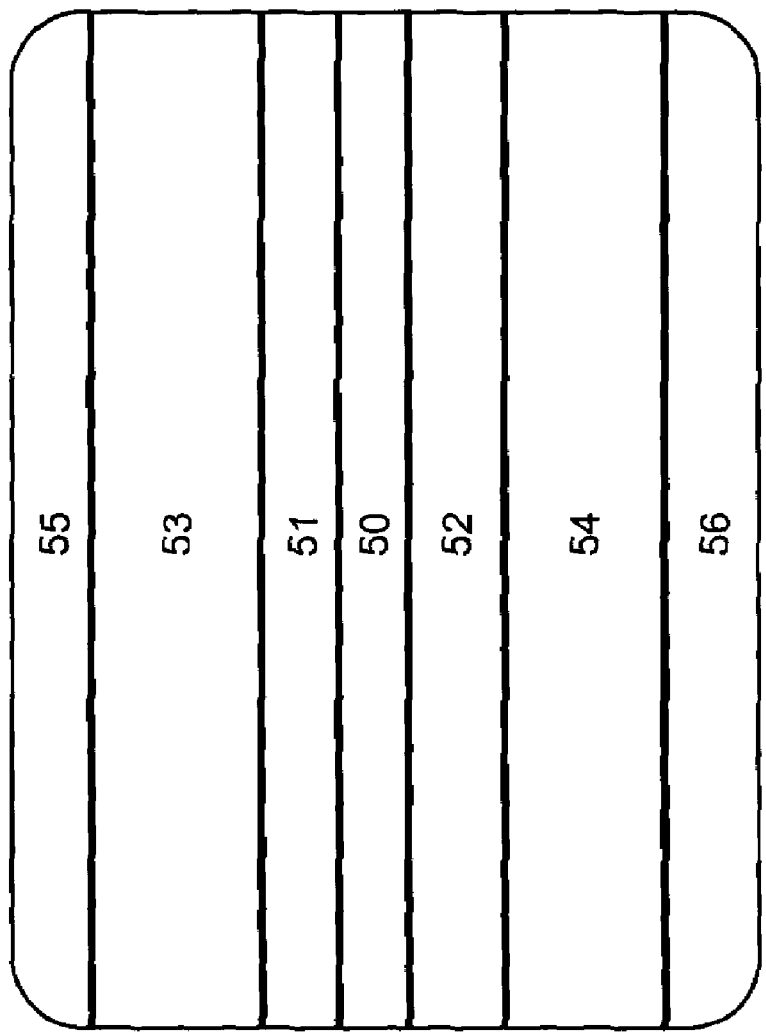
FIG. 5 schematically depicts a waveguide comprising a first, a second, and a third layer and two cores.

In another embodiment, a waveguide comprising a second core further comprises a second layer located between the second core and the first layer and a third layer located between the first layer and the first core. The second and third layers each have an index of refraction that is greater than the refractive index of the first layer but less than the refractive index of the first and second cores. As in the example illustrated in FIG. 5, the second layer 51 is typically in contact with the second core 53 and the first layer 50, and the third layer 52 is typically in contact with the first layer 50 and the first core 54. In this embodiment, the cladding portions 55 (shown in contact with the second core 53) and 56 (shown in contact with the first core 54) preferably have an index of refraction less than that of the first and second cores. The second and third layers can be the same or different materials, and preferably are formed from a material that is substantially nonabsorbing and scattering at the relevant wavelengths (e.g., greater than about 300 nm, or between about 300 or 400 nm and about 10 or 20 micrometers). In this embodiment, the first layer is typically a thin layer having a high concentration of nanostructures. The high concentration of nanostructures in the first layer permits efficient absorption of light, which is re-emitted primarily into the surrounding second and third layers and then passes into the cores. Removal of the light from the nanostructure layer reduces losses from scattering and reabsorption of the emitted light by the nanostructures.

In any of the above embodiments, the first layer can consist e.g., of a plurality of substantially pure nanostructures, e.g., nanostructures without a surrounding matrix. Such a layer can be formed, for example, by spin-casting or otherwise depositing a solution of nanostructures in a solvent on the surface of a core or other layer and then evaporating the solvent. Alternatively, the first layer can comprise e.g., one or more nanostructures in a matrix (the first layer can be a nanocomposite). Preferred matrices have a relatively low index of refraction, since the first layer preferably has a refractive index that is less than that of the first (and second, if present) core. The matrix can be, for example, a small molecule or molecular matrix or a matrix comprising at least one polymer or glass. A number of small molecules, glasses, and polymers (e.g., organic, inorganic, and organometallic polymers) are known in the art (e.g., those mentioned and/or referenced herein). In a preferred embodiment, the first layer comprises one or more nanostructures in a matrix comprising a polysiloxane, preferably polydimethylsiloxane (PDMS). In another preferred embodiment, the matrix comprises an inorganic glassy material such as $SiO_2$ or $TiO_2$. The nanostructures can but need not be dispersed uniformly throughout the first layer, e.g., the nanostructures can be located primarily in a portion of the first layer that is adjacent to one of the cores.

The cladding comprises a material that has a lower refractive index than the core, e.g., a lower refractive index solid, liquid, or gas, e.g., air, a low index plastic or polymer film or sheet, or any other convenient material having a smaller index of refraction than the core. The first and second portions of the cladding need not comprise the same material.

To optimize the number of photons that can be waveguided and collected, the first core is preferentially substantially nonabsorbing and nonscattering with respect to relevant wavelengths (including, for example, those wavelengths emitted by the nanowires or branched nanowires distributed on the core). For a waveguide for use in a solar concentrator, for example, the first core is preferably substantially nonabsorbing and nonscattering to light in the visible, near-infrared, and infrared range, and thus is preferably substantially nonabsorbing and nonscattering with respect to wavelengths greater than about 300 nm (e.g., greater than about 300 or 400 nm and less than about 10 or 20 micrometers). The larger the index difference at a dielectric interface, the smaller the critical angle for that interface and the larger the number of photons emitted into the core by the nanostructures that are waveguided by total internal reflection and collected. Thus the use of high index cores is advantageous. For example, the first core can have an index of refraction greater than about 1.35, greater than about 2.5, greater than about 3.3, or even greater than 4. Preferably, the first core has an index of refraction between about 1.35 and about 4. In some instances, a physical property of the first core such as e.g. its mechanical strength can be another criterion used to select an appropriate core material, since in some embodiments the waveguide (and typically also the core) is a flat sheet, which can be of considerable size. (As will be evident, weaker materials can still be formed into large sheets, e.g. with the provision of suitable physical support.) Similar considerations apply to the second core.

The first (or second) core can comprise e.g. a glass, a polymer, an organic polymer, an inorganic polymer, an organometallic polymer, a small molecule or molecular matrix, a gel, a liquid, a crystal, a polycrystal, or a mesoporous matrix; a number of these are known (e.g., the example polymers and small molecules mentioned and/or referenced herein). Example materials for the first (or second) core include but are not limited to acrylic and poly (methyl methacrylate); a large number of other suitable materials are known in the art.

To reduce losses in the waveguide, the first layer is preferably substantially nonscattering with respect to light at relevant wavelengths (e.g., the wavelengths absorbed and emitted by the nanostructures). For example, for a waveguide for use in a solar concentrator, the first layer is preferably substantially nonscattering to light in the visible, near-infrared, and infrared range, and thus is preferably substantially nonscattering with respect to wavelengths greater than about 300 nm (e.g., greater than about 300 or 400 nm and less than about 10 or 20 micrometers). The first layer is also preferably substantially nonabsorbing with respect to the wavelength or wavelengths of light emitted by the nanostructures in the layer.

In a preferred embodiment, the first layer has a thickness less than about one wavelength of the light emitted by the one or more nanostructures. For a waveguide for use with visible light, for example, the first layer can have a thickness less than about 1000 nm (e.g., for near-infrared light), less than about 900 nm, less than about 800 nm, less than about 700 nm, less than about 600 nm, less than about 500 nm (e.g., for green light), or less than about 400 nm. The thickness of the first layer affects the efficiency of the waveguide because the effect on which this class of embodiments is based, the emission of light by a radiating dipole into the higher index material at a dielectric interface, decreases as the dipole is moved away from the interface and has no effect beyond the distance of about one wavelength of the light emitted. In most cases, a layer substantially thinner than this can be used to absorb substantially all the incident light, so this does not result in a performance limitation.

The first layer can comprise one or more nanostructures (e.g., nanowires, branched nanowires, or nanocrystals), or a plurality of nanostructures. The one or more nanostructures can be fabricated from essentially any convenient materials. For example, the nanostructures can comprise a semiconducting material, for example a material comprising a first element selected from group 2 or from group 12 of the periodic table and a second element selected from group 16 (e.g., ZnS, ZnSe, ZnTe, CdS, CdSe, CdTe, HgS, HgSe, HgTe, MgS, MgSe, MgTe, CaS, CaSe, CaTe, SrS, SrSe, SrTe, BaS, BaSe, BaTe, and like materials); a material comprising a first element selected from group 13 and a second element selected from group 15 (e.g., GaN, GaP, GaAs, GaSb, InN, InP, InAs, InSb, and like materials); a material comprising a group 14 element (Ge, Si, and like materials); a material such as PbS, PbSe, PbTe, AlS, AlP, and AlSb; or an alloy or a mixture thereof. Preferred materials include CdTe, InP, InAs, PbS, PbSe, PbTe, CdSe, and CdS. For use in an optical waveguide or light concentrator, the nanostructures preferably comprise a fluorescent material, more preferably one with a high quantum yield (e.g., a quantum yield greater than about 5%, 10%, 20%, 50%, or 75%). For nanostructures absorbing light with wavelengths between 300 and 3000 nm, the nanostructures can comprise one or more materials having a band-gap energy between about 0.4 eV and about 4.1 eV.

Each nanostructure can comprise a single material or can be a heterostructure comprising at least two different and/or distinguishable materials. The two or more materials can be entirely different (e.g., can have different chemical compositions), or they can comprise the same base material but have different dopants or different concentrations of the same dopant. The heterostructures can be core-shell heterostructures, in which a nanowire, branched nanowire, or nanocrystal comprises a core of a first material and at least one shell of a second (or third etc.) material, where the materials are distributed radially about the long axis of the nanowire, the long axis of an arm of the branched nanowire, or the center of the nanocrystal. (Suitable materials for a fluorescence efficiency-enhancing shell include e.g. materials having a higher band gap energy than the material forming the nanostructure's core. In addition to having a band gap energy greater than that of the core material, suitable materials for the shell can have e.g. good conduction and valence band offset with respect to the core material. That is, the conduction band is preferably higher and the valence band is preferably lower than those of the core material. For cores that emit energy in the visible range (e.g., CdS, CdSe, CdTe, ZnSe, ZnTe, GaP, GaAs) or nearinfrared (e.g., InP, InAs, InSb, PbS, PbSe), a material that has a band gap energy e.g. in the ultraviolet range can be used (e.g., ZnS, GaN, and magnesium chalcogenides, e.g., MgS, MgSe, and MgTe). For a core that emits in the near-infrared, materials having a band gap energy e.g. in the visible range (e.g. CdS or CdSe) can also be used.) Alternatively, the different materials can be distributed at different locations within the nanostructure. For example, the different materials can be at different locations along the long axis of a nanowire or along the long axis of an arm of a branched nanowire, or different arms of a branched nanowire can comprise different materials.

The size of the nanostructures can be varied; for example, to control the wavelengths emitted by the nanostructures. In certain embodiments, the waveguides comprise nanowires having an average diameter between about 2 nm and about 100 nm (e.g., between about 2 nm and about 50 nm, or between about 2 nm and about 20 nm). For certain embodiments (e.g., embodiments in which the nanowires are oriented perpendicular to the surface of a thin first layer), nanowires with shorter aspect ratios are preferred; thus, in some embodiments the nanowires preferably have an aspect ratio between about 1.5 and about 100, e.g. between about 5 and about 30. In certain embodiments, the waveguides comprise nanocrystals having an average diameter between about 1.5 nm and about 15 nm (e.g., between about 2 nm and about 5 nm, between about 5 nm and about 10 nm, or between about 10 nm and about 15 nm). The nanocrystals typically have an aspect ratio between about 0.1 and about 1.5, e.g., between about 0.5 and about 1.5, preferably between about 1 and about 1.5.

In some embodiments, the first layer comprises a plurality of nanowires, which can be either randomly or substantially nonrandomly oriented. In a preferred embodiment, the orientation of the nanowires is substantially nonrandom, with the vector average of the nanowires' orientations having a nonzero component perpendicular to a surface of the first core. Preferably at least 1%, more preferably at least 10%, and most preferably at least 50% of all the nanowires in the first layer are substantially nonrandomly oriented in this manner, since the greater the degree of orientation perpendicular to the surface of the core, the greater the efficiency of capture of the re-emitted light. In one embodiment, a majority of the nanowires each has its long axis oriented more nearly perpendicular to than parallel to a surface of the first core. In one specific embodiment, the nanowires within the first layer form a liquid crystal phase, in which each nanowire has its long axis oriented substantially perpendicular to a surface of the first core. The use of a liquid crystal phase results in a first layer that absorbs light from substantially all directions equally but emits light primarily into the adjacent higher index material at angles greater than the critical angle, providing a highly efficient light concentrator (as much as eight times more efficient than a similar concentrator where the nanowires are embedded inside the waveguide core).

In other embodiments, the first layer comprises a thin film comprising or consisting of nanocrystals. The nanocrystals emit more light into the adjacent higher index material (e.g., the core) at an angle greater than the critical angle, but the effect is not as pronounced as for a first layer comprising nanowires (particularly substantially nonrandomly oriented nanowires). A waveguide containing nanocrystals distributed on a core is, however, still more efficient than a waveguide containing quantum dots embedded in the core. If the nanocrystals have a unique crystal axis, efficiency can be increased by substantially nonrandomly orienting the nanocrystals such that a vector average of the nanocrystals orientations has a nonzero component perpendicular to a surface of the core. The greater the degree of orientation perpendicular to the surface of the core, the greater the efficiency of capture of the reemitted light.

In all embodiments, at least one collector for collecting the waveguided light (e.g., a detector, fiber optic cable, photocell, or solar cell) is optionally operably connected to at least one edge of the first core. In embodiments in which the waveguide comprises a second core, a second collector can optionally be connected to at least one edge of the second core. Optionally, any edges or portions of an edge of the core or cores not occupied by the collector can be mirrored or silvered.

Any of the embodiments described above can be used to form multilayer tandem light concentrators, in which different wavelengths (or different single bands of wavelengths) are collected in different layers and waveguided, e.g., to photocells or solar cells optimized for these specific wavelengths. (As one example, one layer can concentrate near ultraviolet-low wavelength visible light, another layer can concentrate visible-near infrared light, and a third layer can concentrate near infrared-infrared light.) Such a multilayer light concentrator comprises a stack of two or more waveguides as described above. It will be noted that there need be no physical distinction or delineation between the cladding of successive waveguides in such a stack, as long as the cladding has an index of refraction that is less than the index of refraction of each of the cores. The order of the waveguides within the stack is preferably such that the waveguide comprising the nanostructures absorbing the shortest wavelength light (having the highest band-gap) is located closest to the light source (e.g., the sun) and the waveguide comprising the nanostructures absorbing the longest wavelength light (having the smallest band-gap) is located farthest from the light source. In an alternative embodiment, a multi-layer concentrator can be fabricated such that it is symmetrically structured with the lowest energy bandgap waveguide in the center of the stack and increasing bandgap energies as the waveguide layers extend above and below the center layer(s). In this embodiment, light can impinge on the stack from either side with equal efficiency. A multilayer light concentrator can also be assembled as a stack of waveguides in which at least one waveguide comprises nanowires within the core and at least one waveguide comprises nanostructures distributed on the core (each waveguide can include any of the variations described above).

Emission Properties of Nanostructures

Note that one of the characteristics of all of the previous embodiments is that the nanostructures typically absorb light over a broad spectral range, e.g. compared to a dye molecule with emission at comparable wavelengths. The wavelength range over which light is absorbed can also be e.g. substantially broader than the range over which light is emitted. For example, a nanostructure can emit light over a narrow spectral range, e.g., less than about 60 nm, preferably less than about 40 nm or about 30 nm.

An additional characteristic of previous embodiments is that, for nanostructures, absorption typically increases in strength the farther in energy the light is from the emission wavelength (at shorter wavelengths only). For example, a nanorod with emission at 700 nm can absorb 300 nm light more strongly than 400 nm light, which can be more strongly absorbed than 500 nm light, which can be more strongly absorbed than 600 nm light. This is very different than what is observed for dye molecules, e.g. in a solar concentrator. For dyes, the absorption peaks at an energy very close to the emission energy and then decreases quickly. As a result, conversion of light impinging on a dye molecule solar concentrator is very inefficient, since most of the wavelengths are not strongly absorbed.

Figure 6A:
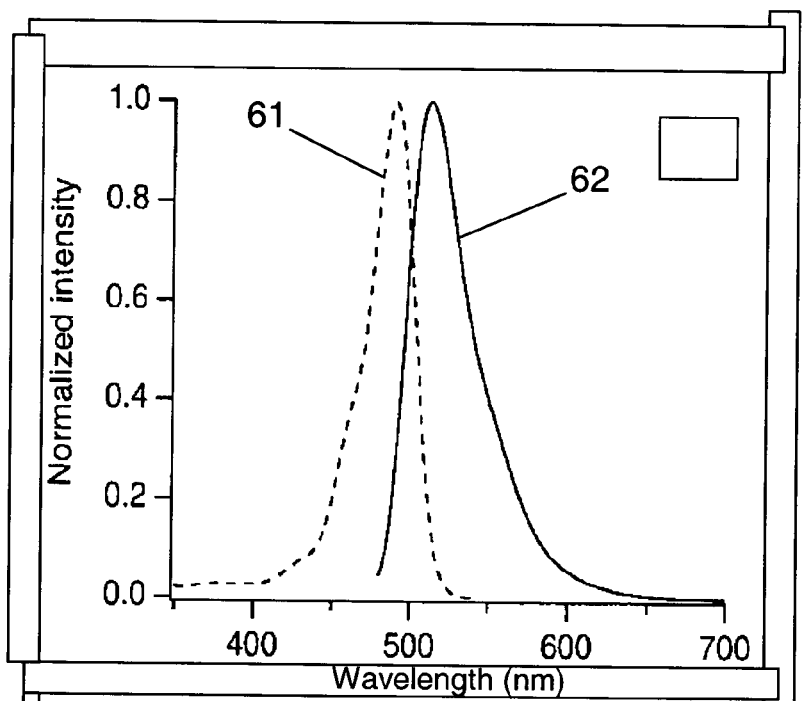
FIG. 6 illustrates absorption and emission by the organic dye fluorescein (Panel A) and by spherical CdSe nanocrystals with an aspect ratio of about 1.1 and an average diameter of about 2.3 nm (Panel B).
Figure 6B:
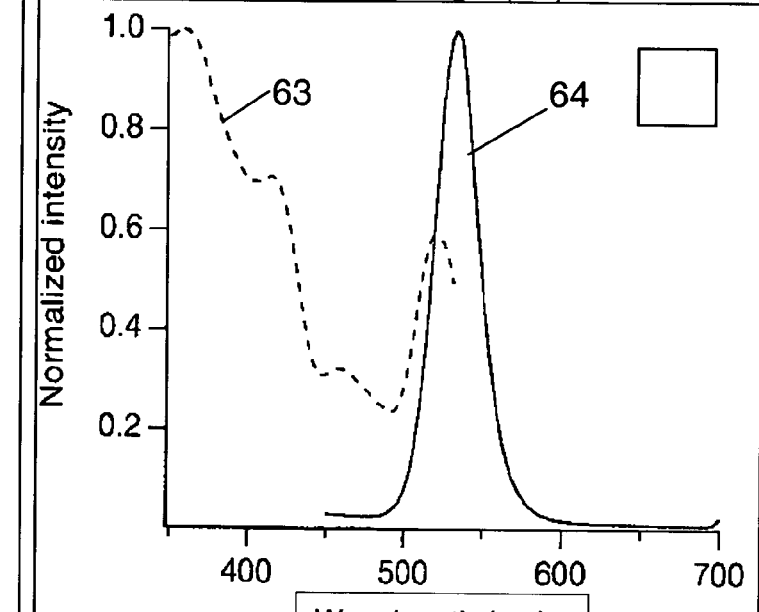

FIG. 6 depicts examples of absorption and emission spectra for a dye and a nanostructure. Panel A depicts absorption (61) and emission (62) by the organic dye fluorescein. Panel B depicts absorption (63) and emission (64) by spherical CdSe nanocrystals with an aspect ratio of about 1.1 and an average diameter of about 2.3 nm. Other dyes and nanostructures have spectra with comparable features, e.g., generally comparable shape.

Orientation of Nanowires and other Nanostructures

Substantially nonrandom orientation of nanostructures (particularly nanowires) is frequently desirable, e.g., within a composite material. For example, as described above, waveguides and light concentrators comprising nonrandomly oriented nanostructures can be more efficient than similar waveguides or concentrators comprising randomly oriented nanostructures.

Composites in which Matrix Orients Nanowires

One aspect of the present invention provides a composite material comprising a plurality of nanowires and a small molecule or molecular matrix or a matrix comprising at least one polymer, where the matrix (or the components and/or precursors of the matrix) is used to orient the nanowires (to produce a substantially nonrandom distribution of nanowire orientations). The nanowires can be fabricated of essentially any convenient material (e.g., a semiconducting material, a ferroelectric material, a metal, etc.) and can comprise essentially a single material or can be heterostructures.

In one embodiment, the matrix comprises a polymer that exhibits a liquid crystal phase. A combination of polymer and nanowires is selected, such that the mixture also exhibits a liquid crystal phase. For example, a solution of nanowires (e.g., at a high concentration of nanowires) and polymer can be mixed together and placed in a small electric field to orient them in the desired direction. Typically, the polymer and the nanowires have comparable lengths; therefore, shorter nanowires are preferred (e.g., nanowires having lengths less than about 100 nm, less than about 50 nm, or less than about 20 nm). Liquid crystal polymers include, e.g., poly(m-phenylene isophthalamide), poly(p-benzamide), poly(alkyl isonitriles), polyisocyanates, and a number of other polymers, see e.g., Dietrich Demus, John W. Goodby, George W. Gray, Hans W. Spiess, and Volkmar Vill (1998) *Handbook of Liquid Crystals, Handbook of Liquid Crystals: Four Volume Set*, John Wiley and Sons, Inc.

Methods for Orienting Nanowires

As described in the preceding section, a liquid crystalline polymer or other polymeric or small molecule or molecular matrix can be used orient nanowires. Other methods for orienting nanowires are known to those of skill in the art. Liquid crystal phases of nanowires (e.g., nanorods) are described in, for example, Li et al (2002) "Semiconductor nanorod liquid crystals" *Nano Letters* 2: 557–560. Nanorods aligned along the stretching direction in stretched polymer films are described in e.g. Peng et al (2000) "Shape control of CdSe nanocrystals" *Nature* 404: 59–61. As another example, aligned nanowires can be grown substantially in situ as a field of oriented structures that are subsequently integrated into the polymer matrix. Methods of fabricating such fields of aligned nanostructures are described, e.g., in Published US Patent Application 2002/0172820 and 2002/0130311. Methods of orienting nanowires also include electric field assisted orientation of nanowires (e.g., nanorods), e.g., applying an electric field to cause magnetic nanorods to orient in a desired direction, in a polymer matrix which optionally can be hardened to maintain the orientation.

Orientation of other Nanostructures

Other nanostructures can also be oriented to some degree. See e.g., Alivisatos (2000) "Naturally Aligned Nanocrystals" *Science*, 289, 736. For example, nanotetrapods can be self-orienting. When deposited on a surface, the nanotetrapods typically contact the surface via three arms; the fourth arm is perpendicular to the surface. In some cases, nanocrystals will spontaneously align with their unique crystal axis oriented vertically when they are packed at high density on a surface. In certain preferred embodiments, such nanocrystals are substantially faceted in shape such that the lowest energy packing state is one in which the non-symmetric unique axis of every nanocrystal is oriented vertically.

Methods for Verifying Orientation

The extent to which the nanostructures in a collection of nanostructures are ordered or nonrandomly oriented can be determined through various methods. For example, electron microscopy (e.g., SEM, TEM), atomic force microscopy (AFM), or scanning tunneling microscopy (STM) can readily be performed, e.g., on cross-sections of a nanocomposite material. In addition, in many cases, optical microscopy such as polarization or DIC microscopy can be used to determine the average orientation of nanowires or nanocrystals within a material. Electrostatic force microscopy can also be used in some cases to determine orientation due to an intrinsic dipole in many nanocrystals and nanowires oriented along their unique crystal axis.

Polysiloxane Nanocomposites

One aspect of the invention provides a composite material comprising one or more nanostructures and a polymeric matrix comprising a polysiloxane (e.g., a composite material comprising one or more nanostructures and a polymeric matrix consisting of a polysiloxane). A polysiloxane is an inorganic polymer whose backbone comprises alternating silicon and oxygen atoms; each silicon has two side groups. These groups can be e.g., a hydrogen atom, any organic group, or any alkyl group. Example polysiloxanes include but are not limited to polydimethylsiloxane (PDMS), polymethylphenylsiloxane, polydiphenylsiloxane, and polydiethylsiloxane. A polysiloxane can also be a copolymer comprising at least two different types of siloxane monomers, e.g., dimethylsiloxane and methylhydrogensiloxane (in which one of the side groups is a methyl group and the other side group is a hydrogen). In preferred embodiments, the composite comprises one or more nanostructures in a matrix comprising polydimethylsiloxane (PDMS) or in a matrix comprising a copolymer between dimethylsiloxane and another siloxane (e.g., methylhydrogensiloxane). The polysiloxane matrix can comprise e.g. linear or cross-linked polysiloxane oligomers. The matrix can be e.g. substantially free of silicates. The polymeric matrix is distinct from ORMOSIL (organically modified silicate) matrices.

PDMS and other siloxane polymers are commercially readily available. For example, kits comprising vinyl-terminated dimethylsiloxane oligomers (FIG. 7, Panel A), siloxane cross-linkers (polysiloxane oligomers where the monomers are usually dimethylsiloxane but occasionally methylhydrogensiloxane, Panel B), and a catalyst (which catalyzes the addition of an SiH bond across a vinyl group to form an Si—$CH_2$—$CH_2$—Si linkage, as illustrated in Panel C) are generally commercially available, e.g., from Dow Corning (SYLGARD 184™, www.dowcorning.com).

The nanostructures can be e.g., nanowires, nanocrystals, branched nanowires (e.g., nanotetrapods, tripods, or bipods), nanoparticles, teardrops, or any other desired nanostructures. The nanostructures can be fabricated from essentially any convenient material. The nanostructures can comprise e.g. one or more metals (e.g., Au, Ag, Ni, Cu, Zn, or Pt), or an alloy or mixture thereof. The nanostructures can comprise e.g., a ferroelectric or ferroelectric ceramic material, including, for example, a perovskite-type material (including but not limited to $BaTiO_3$, $SrTiO_3$, $CaTiO_3$, $KNbO_3$, $PbTiO_3$, $LiTiO_3$, $LiTaO_3$, or $LiNbO_3$, or a material derived from these, for example, $Ba_{(1-x)}Ca_xTiO_3$ where x is between 0 and 1, or $PbTi_{(1-x)}Zr_xO_3$ where x is between 0 and 1); a KDP-type material (e.g., $KH_2PO_4$, $KD_2PO_4$, $RbH_2PO_4$, $RbH_2AsO_4$, $KH_2AsO_4$, or GeTe, or a material from these); a TGS-type material (e.g., tri-glycine sulfate, tri-glycine selenate, or a material derived from these); or a mixture thereof. As another example, the nanostructures can comprise a semiconducting material, for example, a material comprising a first element selected from group 2 or from group 12 of the periodic table and a second element selected from group 16 (e.g., ZnS, ZnSe, ZnTe, CdS, CdSe, CdTe, HgS, HgSe, HgTe, MgS, MgSe, MgTe, CaS, CaSe, CaTe, SrS, SrSe, SrTe, BaS, BaSe, BaTe, and like materials); a material comprising a first element selected from group 13 and a second element selected from group 15 (e.g., GaN, GaP, GaAs, GaSb, InN, InP, InAs, InSb, and like materials); a material comprising a group 14 element (Ge, Si, and like materials); a material such as PbS, PbSe, PbTe, AlS, AlP, and AlSb; or an alloy or a mixture thereof. For use in an optical waveguide or light concentrator, for example, the nanostructures preferably comprise a fluorescent material, more preferably one with a high quantum yield (e.g., a quantum yield greater than about 5%, 10%, 20%, 50%, or 75%). For nanostructures absorbing light with wavelengths between 300 and 3000 nm, the nanostructures can comprise one or more materials having a band-gap energy between about 0.4 eV and about 4.1 eV. Each nanostructure can comprise a single material or can be a heterostructure comprising at least two different and/or distinguishable materials.

The composite material can further comprise at least one surfactant or at least one solvent. For example, the composite can comprise a surfactant used to assist in uniformly dispersing the nanostructures throughout the polysiloxane matrix. The surfactant can interact with the surface of the nanostructures and with the polysiloxane monomers or polymer. In addition, the surfactant can be attached to the surface of the nanostructures by ionic or covalent bonds, or other molecular forces and/or to the polymer by ionic or covalent bonds, or other molecular forces.

The polysiloxane nanocomposite of this invention can be formed into a number of shaped articles. A light-emitting diode (LED), laser, waveguide (e.g., as described herein), or amplifier, for example, can comprise a polysiloxane-containing composite. See e.g. US 20010046244 entitled "Optical amplifiers and lasers" by Klimov et al. In particular, it is possible to form a variety of optically relevant structures such as waveguides and optical gratings using polysiloxane templated onto a secondary structure (as is known in the art). Such structures will be greatly improved by the inclusion of one or more nanostructures to provide additional optical, electronic, or other functionality to an otherwise passive material. In addition, it is known that polysiloxanes such as PDMS are useful in the formation of microfluidic devices. The composite of the present invention allows the incorporation of active optical components into such devices.

Additional Nanocomposites

One class of embodiments provides a composite material that comprises either a small molecule or molecular matrix or a matrix comprising at least one organic polymer or an inorganic glass and one or more branched nanowires or one or more inorganic nanowires (or a combination thereof). The inorganic nanowires have an aspect ratio greater than about 10 (e.g., greater than about 15, greater than about 20, or greater than about 50) and can be either semiconducting or ferroelectric. The branched nanowires can be nanotetrapods, for example, or can be other branched structures such as e.g. tripods or bipods.

In some embodiments, the composite comprises a plurality of inorganic nanowires, which can be either randomly or substantially nonrandomly oriented. In some preferred embodiments, the composite material is formed into a thin film within which the orientation of the inorganic nanowires is substantially nonrandom. For example, at least 1% (e.g., at least 10%, or at least 50%) of all the nanowires in the film can be substantially nonrandomly oriented. The thin film can be either substantially free of strain, or it can be highly strained (for example, if the nonrandom orientation of the nanowires is achieved by stretching the film). In one embodiment, the composite is formed into a thin film within which a majority of the nanowires are oriented such that each nanowire has its long axis substantially parallel to a surface of the film. In another embodiment, the composite is formed into a thin film within which a majority of the nanowires are oriented such that each nanowire has its long axis more nearly perpendicular than parallel to a surface of the film. In yet another embodiment, the composite is formed into a thin film within which a majority of the nanowires are oriented such that each nanowire has its long axis substantially perpendicular to a surface of the film.

The inorganic nanowires can be fabricated from a ferroelectric or ferroelectric ceramic material. For example, the inorganic nanowires can comprise a perovskite-type material (including but not limited to $BaTiO_3$, $SrTiO_3$, $CaTiO_3$, $KNbO_3$, $PbTiO_3$, $LiTiO_3$, $LiTaO_3$, or $LiNbO_3$, or a material derived from these, for example, $Ba_{(1-x)}Ca_xTiO_3$ where x is between 0 and 1, or $PbTi_{(1-x)}Zr_xO_3$ where x is between 0 and 1); a KDP-type material (e.g., $KH_2PO_4$, $KD_2PO_4$, $RbH_2PO_4$, $RbH_2AsO_4$, $KH_2AsO_4$, or GeTe, or a material derived from these); a TGS-type material (e.g., tri-glycine sulfate, tri-glycine selenate, or a material derived from these); or a mixture thereof. Alternatively, the inorganic nanowires can be fabricated from a semiconducting material. For example, the nanowires can comprise a material comprising a first element selected from group 2 or from group 12 of the periodic table and a second element selected from group 16 (e.g., ZnS, ZnSe, ZnTe, CdS, CdSe, CdTe, HgS, HgSe, HgTe, MgS, MgSe, MgTe, CaS, CaSe, CaTe, SrS, SrSe, SrTe, BaS, BaSe, BaTe, and like materials); a material comprising a first element selected from group 13 and a second element selected from group 15 (e.g., GaN, GaP, GaAs, GaSb, InN, InP, InAs, InSb, and like materials); a material comprising a group 14 element (Ge, Si, and like materials); a material such as PbS, PbSe, PbTe, AlS, AlP, and AlSb; or an alloy or a mixture thereof.

The branched nanowires can be fabricated from essentially any convenient material. For example, the branched nanowires can comprise a metal (e.g., Ag, Au, Ni, Cu, Zn, or Pt) or a ferroelectric or semiconducting material (e.g., those listed in previous sections).

In certain embodiments, the composite comprises a small molecule or molecular matrix. A variety of such matrices are known in the art, comprising e.g., molecular organics such as those used in OLEDs; N,N'-diphenyl-N,N'-bis(3-methylphenyl)-(1,1'biphenyl)-4,4'-diamine)(TPD); (3-(4-biphenyl)-4-phenyl-5-tert-butylphenyl-1,2,4-triazole)(TAZ); tris-(8-hydroxyquinoline)aluminum($Alq_3$); benzoic acid; phthalic acid; benzoin; hydroxyphenol; nitrophenol; chlorophenol; chloroaniline; or chlorobenzoamide. Preferred small molecules have at least one polar functional group and have a high enough melting point that they are solid at room temperature. In other embodiments, the matrix comprises an inorganic glass. A variety of such glasses are known in the art, e.g., $SiO_2$ or $TiO_2$.

In other embodiments, the composite comprises a matrix comprising at least one organic polymer. A wide variety of such polymers is known to those of skill in the art (see e.g., Dietrich Demus, John W. Goodby, George W. Gray, Hans W. Spiess, and Volkmar Vill (1998) *Handbook of Liquid Crystals, Handbook of Liquid Crystals: Four Volume Set*, John Wiley and Sons, Inc.; Johannes Brandrup (1999) Polymer Handbook, John Wiley and Sons, Inc.; and Charles A. Harper (2002) Handbook of Plastics, Elastomers, and Composites, 4$^{th}$ edition, McGraw-Hill). Examples include thermoplastic polymers (e.g., polyolefins, polyesters, polysilicones, polyacrylonitrile resins, polystyrene resins, polyvinyl chloride, polyvinylidene chloride, polyvinyl acetate, or fluoroplastics); thermosetting polymers (e.g., phenolic resins, urea resins, melamine resins, epoxy resins, polyurethane resins); engineering plastics (e.g., polyamides, polyacrylate resins, polyketones, polyimides, polysulfones, polycarbonates, polyacetals); and liquid crystal polymers, including main chain liquid crystal polymers (e.g., poly(hydroxynapthoic acid)) and side chain liquid crystal polymers (e.g., poly <n-((4'(4"-cyanphenyl)phenoxy)alkyl)vinyl ether>). Certain embodiments include conductive organic polymers; see e.g. T. A. Skatherin (ed.) *Handbook of Conducting Polymers I*. Examples include but are not limited to poly (3-hexylthiophene)(P3HT), poly[2-methoxy, 5-(2'-ethylhexyloxy)-p-phenylene-vinylene] (MEH-PPV), poly(phenylene vinylene)(PPV), and polyaniline.

The diameter of the inorganic nanowires can be varied, for example, to control the wavelength emitted by fluorescent nanowires. The diameter of the nanowires is preferably between about 2 nm and about 100 nm, more preferably between about 2 nm and about 5 nm or between about 10 nm and about 50 nm. The length of the nanowires can also be varied. In certain embodiments, the inorganic nanowires have an aspect ratio between about 10 and about 10,000 (e.g., between about 20 and about 10,000, between about 50 and about 10,000, or between about 100 and about 10,000).

The composite materials comprising ferroelectric nanowires or ferroelectric branched nanowires have a number of uses. For example, the nanocomposites can be used in data storage media, where information is encoded by flipping the ferroelectric state of individual nanowires or nanoparticles to write bits. As another example, in embodiments where the composite has a high dielectric constant, the composite can be used as an insulator (e.g., formed into thin insulating films such as those printed on circuit boards). The composite materials comprising semiconducting nanowires or semiconducting branched nanowires also have a number of uses. For example, a composite comprising semiconducting nanowires or branched nanowires and e.g. a conductive polymer or small molecule or molecular matrix can be used in a photovoltaic device, where the nanowires conduct the electrons and the polymer or small molecule or molecular matrix is the hole-conducting element.

Nanocomposites with a Blocking Layer

In many applications (e.g., in photovoltaic devices, e.g., devices such as certain of those described in U.S. Patent Application No. 60/421,353, filed Oct. 25, 2002, U.S. Provisional Patent Application No. 60/452,038, filed Mar. 4, 2003, and U.S. patent application Ser. No. 10/656,802, filed Sep. 4, 2003 filed of even date herewith), at least one blocking layer is optionally used to restrict the movement of charges (e.g., to prevent the movement of electrons or holes in a particular direction, through a particular region of a device, or to a particular electrode). A blocking layer is a layer of some material either organic or inorganic, which has either: a high hole conductivity and high electron resistance to allow hole flow and prevent electron flow, or a high electron conductivity and high hole resistance to allow electron flow and prevent hole flow. Blocking layers can be incorporated e.g. onto either one or both sides of the active layer (e.g., a nanocomposite layer) of a photovoltaic device.

For example, one or more blocking layers can be used to prevent a nanostructure photovoltaic cell from beginning to short out upon strong illumination and to assist in the creation of a high carrier density within nanostructures extending across the active layer. As another example, one or more blocking layers can be used to concentrate charges in an active region of a nanostructure-base LED to improve charge recombination within the nanocrystals.

Accordingly, one aspect of the invention provides a composite material comprising a plurality of nanostructures and a small molecule or molecular matrix, a glassy or crystalline inorganic matrix, or a matrix comprising at least one polymer, where the composite is distributed on a first layer of a material that conducts substantially only electrons or substantially only holes.

The composite and the first layer can be in contact with each other (e.g., over all or most of a surface of the first layer), or can be separated, for example, by a second layer comprising a conductive material. The second layer can conduct electrons, holes, or both.

The first layer can be distributed on an electrode. The first layer can be in contact with the electrode (e.g., over all or most of a surface of the first layer), or can be separated, for example, by a layer of a nonconductive material or by a third layer comprising a conductive material. The third layer can conduct electrons, holes, or both.

The nanostructures can be of any desired type (e.g., nanowires, branched nanowires, nanocrystals, or nanoparticles) and can be fabricated of essentially any convenient material (e.g., any metal or semiconducting or ferroelectric material such as those described herein), and can comprise a single material or can be heterostructures. The small molecule or molecular matrix can comprise e.g., molecular organics such as those used in OLEDs; N,N'-diphenyl-N, N'-bis(3-methylphenyl)-(1,1'biphenyl)-4,4'-diamine) (TPD); (3-(4-biphenyl)-4-phenyl-5-tert-butylphenyl-1,2,4-triazole)(TAZ); tris-(8-hydroxyquinoline) aluminum(Alq$_3$); benzoic acid; phthalic acid; benzoin; hydroxyphenol; nitrophenol; chlorophenol; chloroaniline; chlorobenzoamide; or others known in the art. The glassy matrix can comprise any glasses known in the art, e.g., an inorganic glass, e.g., SiO$_2$ or TiO$_2$. The crystalline inorganic matrix can be any of those known in the art, e.g., Al$_2$O$_3$. The polymeric matrix can comprise e.g., an inorganic polymer (e.g., a polysiloxane, a polycarbonessiloxane (a copolymer of siloxane and carborane), or a polyphosphazene), an organometallic polymer (e.g., a ferrocene polymer, a platinum polymer, or a palladium polymer), or an organic polymer (for example, a thermoplastic polymer (e.g., a polyolefin, a polyester, a polysilicone, a polyacrylonitrile resin, a polystyrene resin, polyvinyl chloride, polyvinylidene chloride, polyvinyl acetate, or a fluoroplastic), a thermosetting polymer (e.g., a phenolic resin, a urea resin, a melamine resin, an epoxy resin, a polyurethane resin, an engineering plastic, a polyamide, a polyacrylate resin, a polyketone, a polyimide, a polysulfone, a polycarbonate, or a polyacetal), a liquid crystal polymer, including a main chain liquid crystal polymer (e.g., poly(hydroxynapthoic acid) or a side chain liquid crystal polymer (e.g., poly <n-((4'(4"-cyanphenyl)phenoxy) alkyl)vinyl ether>, or a conducting polymer (e.g., poly(3-hexylthiophene)(P3HT), poly[2-methoxy, 5-(2'-ethyl-hexyloxy)-p-phenylene-vinylene] (MEH-PPV), poly(phenylene vinylene)(PPV), or polyaniline). See e.g., Dietrich Demus, John W. Goodby, George W. Gray, Hans W. Spiess, and Volkmar Vill (1998) *Handbook of Liquid Crystals, Handbook of Liquid Crystals: Four Volume Set*, John Wiley and Sons, Inc.; Johannes Brandrup (1999) Polymer Handbook, John Wiley and Sons, Inc.; Charles A. Harper (2002) Handbook of Plastics, Elastomers, and Composites, 4th edition, McGraw-Hill; T. A. Skatherin (ed.) *Handbook of Conducting Polymers I*; and Ronald Archer *Inorganic and Organometallic Polymers* for other examples.

The first layer can comprise any convenient material that conducts substantially only electrons or substantially only holes. For example, 3-(4-biphenylyl)-4-phenyl-5-tert-butylphenyl-1,2,4-triazole(TAZ) and tris-(8-hydroxyquinoline)aluminum($Alq_3$) conduct electrons but blocks holes, while N,N'-diphenyl-N,N'-bis(3-methylphenyl)-(1,1'-biphenyl)-4,4'-diamine(TPD) transports holes. The first layer can be created, for example, by using a combination of evaporative, spray coating, or spin-coating processes. The evaporation of small molecules and condensation onto a substrate allows for finely controlled deposition and the design of complex layered structures that can be engineered to balance carrier conduction and optimize charge injection into one of the layers.

The second and/or third layer can comprise any convenient conductive material. For example, the second and/or third layers can comprise a metal, a semiconductor, or other material that conducts both electrons and holes, or can comprise a hole or electron conducting material (e.g., TAZ, $Alq_3$, or TPD).

The first, second, third, and nanocomposite layers can be formed e.g., by spin coating, evaporating, or printing (ink-jet, screen, or roll to roll) one layer on top of the other, and then repeating the process, curing or otherwise protecting the lower layers at each step, or by any combination of such methods. In addition, inorganic blocking layers such as $TiO2$ can be formed by vapor deposition of gaseous precursors or nanoparticles of the inorganic material followed by annealing.

Nanocomposites Supporting Charge Separation or Recombination

When light absorbed by the nanostructures in a nanocomposite results in the formation of an electron-hole pair, the electron and hole can either recombine or remain separated. Recombination of an electron and a hole results in luminescence (light emission). This phenomenon is useful in the creation of displays, LEDs, etc. comprising nanocomposites, particularly since the wavelength of light emitted can be controlled, for example, by choosing a nanostructure material having an appropriate band-gap. Recombination of electrons and holes is undesirable in other applications, however. In nanocomposites used in photovoltaic devices, for example, the electron and hole preferably do not recombine but rather travel to opposite electrodes. See also, e.g., U.S. Patent Application No. 60/421,353, filed Oct. 25, 2002, U.S. Provisional Patent Application No. 60/452,038, filed Mar. 4, 2003, and U.S. patent application Ser. No. 10/656,802, filed Sep. 4, 2003 filed of even date herewith. The present invention provides nanocomposite materials that support charge recombination and other materials that support charge separation.

In one class of embodiments, a composite material that can support charge recombination comprises a matrix and one or more nanostructures, where the one or more nanostructures each comprise a core and at least one shell. The core comprises a first semiconducting material having a conduction band and a valence band, and the shell comprises a second semiconducting material having a conduction band and a valence band. The first and second materials have a type I band offset. Examples of Type I band offsets are shown in FIG. 8 Panels B and D (as depicted, the bands are symmetrically offset, but this need not be the case). In one embodiment, the conduction band 89 of the first material is lower than the conduction band 91 of the second material, and the valence band 90 of the first material is higher than the valence band 92 of the second material. (Electron-hole pairs created in the core are thus confined to the core, where they can recombine.) In an alternative embodiment, the conduction band 93 of the first material is higher than the conduction band 95 of the second material, and the valence band 94 of the first material is lower than the valence band 96 of the second material.

The first material comprising the core can comprise e.g., a material comprising a first element selected from group 2 or from group 12 of the periodic table and a second element selected from group 16 (e.g., ZnS, ZnSe, ZnTe, CdS, CdSe, CdTe, HgS, HgSe, HgTe, MgS, MgSe, MgTe, CaS, CaSe, CaTe, SrS, SrSe, SrTe, BaS, BaSe, BaTe, and like materials); a material comprising a first element selected from group 13 and a second element selected from group 15 (e.g., GaN, GaP, GaAs, GaSb, InN, InP, InAs, InSb, and like materials); a material comprising a group 14 element (Ge, Si, and like materials); a material such as PbS, PbSe, PbTe, AlS, AlP, and AlSb; or an alloy or a mixture thereof. The second material comprising the shell can comprise e.g. any of the above semiconducting materials having an appropriate band offset with respect to the first material. (When a second or higher shell is present, it can comprise essentially any convenient material that is different and/or distinguishable from the second material.)

The matrix can e.g. comprise at least one polymer, comprise at least one glass, or be a small molecule or molecular matrix. The matrix can conduct both electrons and holes, conduct substantially only holes, conduct substantially only electrons, be semiconducting, or be substantially nonconductive. Example matrices include those mentioned and/or referenced herein. The nanostructures can comprise e.g., nanocrystals, nanowires, branched nanowires (e.g., nanotetrapods, tripods, or bipods), nanoparticles, or other nanostructures.

In another class of embodiments, a composite material that can support charge recombination comprises one or more nanostructures comprising a first semiconducting material having a conduction band and a valence band and a matrix comprising a second semiconducting material having a conduction band and a valence band. The first and second materials have a type I band offset. In one embodiment, the conduction band of the first material is lower than the conduction band of the second material, and the valence band of the first material is higher than the valence band of the second material. In an alternative embodiment, the conduction band of the first material is higher than the conduction band of the second material, and the valence band of the first material is lower than the valence band of the second material.

In some embodiments, the nanostructures are heterostructures. For example, in one embodiment, each nanostructure comprises a core and at least one shell, and the core comprises the first material. In another embodiment, each nanostructure comprises a core and at least one shell, and the shell comprises the first material. In other embodiments, the nanostructures are not heterostructures, e.g., each nanostructure can comprise substantially a single material, the first material.

The first material can comprise e.g., a material comprising a first element selected from group 2 or from group 12 of the periodic table and a second element selected from group 16 (e.g., ZnS, ZnSe, ZnTe, CdS, CdSe, CdTe, HgS, HgSe, HgTe, MgS, MgSe, MgTe, CaS, CaSe, CaTe, SrS, SrSe, SrTe, BaS, BaSe, BaTe, and like materials); a material comprising a first element selected from group 13 and a second element selected from group 15 (e.g., GaN, GaP, GaAs, GaSb, InN, InP, InAs, InSb, and like materials); a material comprising a group 14 element (Ge, Si, and like materials); a material such as PbS, PbSe, PbTe, AlS, AlP, and AlSb; or an alloy or a mixture thereof.

The matrix can comprise e.g. at least one polymer, comprise at least one glass, or be a small molecule or molecular matrix. The second semiconducting material comprising the matrix can be essentially any known in the art having an appropriate band offset from the first material. Examples include those matrices mentioned and/or referenced herein (see e.g. T. A. Skatherin (ed.) *Handbook of Conducting Polymers I*), and include but are not limited to poly(3-hexylthiophene)(P3HT), poly[2-methoxy, 5-(2'-ethyl-hexyloxy)-p-phenylene-vinylene] (MEH-PPV), poly(phenylene vinylene)(PPV), and polyaniline. The nanostructures can comprise e.g., nanocrystals, nanowires, branched nanowires (e.g., nanotetrapods, tripods, or bipods), nanoparticles, or other nanostructures.

In one class of embodiments, a composite material that can support charge separation comprises a matrix and one or more nanostructures, where the one or more nanostructures each comprise a core and at least one shell. The core comprises a first semiconducting material having a conduction band and a valence band, and the shell comprises a second semiconducting material having a conduction band and a valence band. The first and second materials have a type II band offset. (In such a composite, when an electron-hole pair is created in the core of a nanostructure, one partner (either the electron or the hole) tends to travel, e.g. through the surrounding matrix, while the other partner is confined to the core.) Examples of Type II band offsets are shown in FIG. 8 Panels A and C (as depicted, the bands are symmetrically offset, but this need not be the case). In one embodiment, the conduction band 81 of the first material is lower than the conduction band 83 of the second material, and the valence band 82 of the first material is lower than the valence band 84 of the second material. In an alternative embodiment, the conduction band 85 of the first material is higher than the conduction band 87 of the second material, and the valence band 86 of the first material is higher than the valence band 88 of the second material.

The first material comprising the core can comprise e.g., a material comprising a first element selected from group 2 or from group 12 of the periodic table and a second element selected from group 16 (e.g., ZnS, ZnSe, ZnTe, CdS, CdSe, CdTe, HgS, HgSe, HgTe, MgS, MgSe, MgTe, CaS, CaSe, CaTe, SrS, SrSe, SrTe, BaS, BaSe, BaTe, and like materials); a material comprising a first element selected from group 13 and a second element selected from group 15 (e.g., GaN, GaP, GaAs, GaSb, InN, InP, InAs, InSb, and like materials); a material comprising a group 14 element (Ge, Si, and like materials); a material such as PbS, PbSe, PbTe, AlS, AlP, and AlSb; or an alloy or a mixture thereof. The second material comprising the shell can comprise e.g. any of the above semiconducting materials having an appropriate band offset with respect to the first material. (When a second or higher shell is present, it can comprise essentially any convenient material that is different and/or distinguishable from the second material.)

The matrix can e.g. comprise at least one polymer, comprise at least one glass, or be a small molecule or molecular matrix. The matrix can conduct both electrons and holes, conduct substantially only holes, conduct substantially only electrons, be semiconducting, or be substantially nonconductive. Example matrices include those mentioned and/or referenced herein. The nanostructures can comprise e.g., nanocrystals, nanowires, branched nanowires (e.g., nanotetrapods, tripods, or bipods), nanoparticles, or other nanostructures.

In another class of embodiments, a composite material that can support charge separation comprises one or more nanostructures comprising a first semiconducting material having a conduction band and a valence band and a matrix comprising a second semiconducting material having a conduction band and a valence band. The first and second materials have a type II band offset. In one embodiment, the conduction band of the first material is lower than the conduction band of the second material, and the valence band of the first material is lower than the valence band of the second material. In an alternative embodiment, the conduction band of the first material is higher than the conduction band of the second material, and the valence band of the first material is higher than the valence band of the second material.

In some embodiments, the nanostructures are heterostructures. For example, in one embodiment, each nanostructure comprises a core and at least one shell, and the core comprises the first material. In another embodiment, each nanostructure comprises a core and at least one shell, and the shell comprises the first material. In one specific embodiment, each nanostructure comprises a core comprising a third semiconducting material having a conduction band and a valence band and at least one shell comprising the first material; the third and first materials (the core and the shell) have a type II band offset, and the first and second materials (the shell and the matrix) have a type II band offset. In other embodiments, the nanostructures are not heterostructures, e.g., each nanostructure can comprise substantially a single material, the first material.

The first material can comprise e.g., a material comprising a first element selected from group 2 or from group 12 of the periodic table and a second element selected from group 16 (e.g., ZnS, ZnSe, ZnTe, CdS, CdSe, CdTe, HgS, HgSe, HgTe, MgS, MgSe, MgTe, CaS, CaSe, CaTe, SrS, SrSe, SrTe, BaS, BaSe, BaTe, and like materials); a material comprising a first element selected from group 13 and a second element selected from group 15 (e.g., GaN, GaP, GaAs, GaSb, InN, InP, InAs, InSb, and like materials); a material comprising a group 14 element (Ge, Si, and like materials); a material such as PbS, PbSe, PbTe, AlS, AlP, and AlSb; or an alloy or a mixture thereof.

The matrix can comprise e.g. at least one polymer, comprise at least one glass, or be a small molecule or molecular matrix. The second semiconducting material comprising the matrix can be essentially any known in the art having an appropriate band offset from the first material. Examples include those matrices mentioned and/or referenced herein (see e.g. T. A. Skatherin (ed.) *Handbook of Conducting Polymers I*), and include but are not limited to poly(3-hexylthiophene)(P3HT), poly[2-methoxy, 5-(2'-ethyl-hexyloxy)-p-phenylene-vinylene] (MEH-PPV), poly(phenylene vinylene)(PPV), and polyaniline. The nanostructures can comprise e.g., nanocrystals, nanowires, branched nanowires (e.g., nanotetrapods, tripods, or bipods), nanoparticles, or other nanostructures.

In any of the above embodiments, the nanostructures are optionally substantially nonrandomly oriented in the matrix. For example, a composite material supporting charge recombination or charge separation can comprise a plurality of nanowires that have their long axes more nearly perpendicular than parallel to a first plane (e.g., a surface of a film comprising the composite material); e.g., each nanowire can be substantially perpendicular to the first plane. Similarly, the nanowires can have their long axes more nearly parallel than perpendicular to the first plane; e.g., each nanowire can be substantially parallel to the first plane.

Surface Ligands

Nanostructures (e.g., nanowires, branched nanowires, nanocrystals, or nanoparticles) can comprise one or more surface ligands. Such surface-bound molecules include, for example, surfactant molecules. Surfactants are used, for example, to control the size and/or shape of the nanostructures during their growth process. See e.g. Peng et al. (2000) "Shape control of CdSe nanocrystals" Nature 404, 59–61. Surface ligands can be incorporated during the growth of the nanostructures, or can be incorporated after the nanostructures are fully formed (for example, through surfactant exchange, in which the nanostructures are taken from their growth solution and refluxed several times in a solution containing the desired ligand). See e.g., U.S. patent application Ser. No. 60/389,029 (filed Jun. 13, 2002) by Empedocles entitled "Nanotechnology enabled optoelectronics."

One class of embodiments provides a composite containing nanostructures and a matrix having enhanced affinity for each other, thereby increasing solubility of the nanostructures in and/or assisting dispersal of the nanostructures throughout the matrix.

One embodiment provides a composite material comprising a plurality of nanostructures and a small molecule or molecular matrix or matrix comprising at least one polymer, where the polymer or the constituents of the small molecule or molecular matrix have an affinity for at least a portion of the surface of the nanostructures. Another embodiment provides a composite material comprising a small molecule or molecular matrix or matrix comprising at least one polymer and a plurality of nanostructures, where the nanostructures comprise one or more surface ligands for which the polymer or the constituents of the small molecule or molecular matrix have an affinity.

In a preferred embodiment, the surface ligands on the nanostructures comprise at least one molecule found in the small molecule or molecular matrix or a derivative thereof or at least one monomer found in the at least one polymer or a derivative thereof. The molecules comprising the small molecule or molecular matrix can be any of those known in the art, e.g., molecular organics such as those used in OLEDs; N,N'-diphenyl-N,N'-bis(3-methylphenyl)-(1,1'biphenyl)-4,4'-diamine)(TPD); (3-(4-biphenyl)-4-phenyl-5-tert-butylphenyl-1,2,4-triazole)(TAZ); tris-(8-hydroxyquinoline) aluminum ($Alq_3$); benzoic acid; phthalic acid; benzoin; hydroxyphenol; nitrophenol; chlorophenol; chloroaniline; or chlorobenzoamide. Similarly, the monomer can be essentially any monomer, e.g., a monomeric unit of an organic, an inorganic, or an organometallic polymer (e.g., a polysiloxane, a polycarbonessiloxane, a polyphosphazene, a ferrocene polymer, a platinum polymer, a palladium polymer, a thermoplastic polymer (e.g., a polyolefin, a polyester, a polysilicone, a polyacrylonitrile resin, a polystyrene resin, polyvinyl chloride, polyvinylidene chloride, polyvinyl acetate, or a fluoroplastic), a thermosetting polymer (e.g., a phenolic resin, a urea resin, a melamine resin, an epoxy resin, a polyurethane resin, an engineering plastic, a polyamide, a polyacrylate resin, a polyketone, a polyimide, a polysulfone, a polycarbonate, or a polyacetal), a liquid crystal polymer, including a main chain liquid crystal polymer (e.g., poly(hydroxynapthoic acid) or a side chain liquid crystal polymer (e.g., poly <n-((4'(4"-cyanphenyl)phenoxy) alkyl)vinyl ether>, or a conducting polymer (e.g., poly(3-hexylthiophene)(P3HT), poly[2-methoxy, 5-(2'-ethyl-hexyloxy)-p-phenylene-vinylene] (MEH-PPV), poly(phenylene vinylene)(PPV), or polyaniline). See e.g., Dietrich Demus, John W. Goodby, George W. Gray, Hans W. Spiess, and Volkmar Vill (1998) *Handbook of Liquid Crystals, Handbook of Liquid Crystals: Four Volume Set*, John Wiley and Sons, Inc.; Johannes Brandrup (1999) Polymer Handbook, John Wiley and Sons, Inc.; Charles A. Harper (2002) Handbook of Plastics, Elastomers, and Composites, $4^{th}$ edition, McGraw-Hill; T. A. Skatherin (ed.) *Handbook of Conducting Polymers I*; and Ronald Archer *Inorganic and Organometallic Polymers* for other examples.) For example, a typical surface ligand can comprise a derivative of one of the above monomers or molecules, where the derivative comprises at least one group that attaches to the surface of the nanostructure (e.g., an amine, a phosphine, a phosphine oxide, a phosphonate, a phosphonite, a phosphinic acid, a phosphonic acid, a thiol, an alcohol, or an amine oxide). As another example, the derivative can comprise a group with an affinity for a second surface ligand attached to the surface of the nanostructure.

The surface ligands can each comprise e.g. at least one functional group to bind to the surface of the nanostructures, e.g., an amine, a phosphine, a phosphine oxide, a phosphonate, a phosphonite, a phosphinic acid, a phosphonic acid, a thiol, an alcohol, or an amine oxide.

High Dielectric Composites and Compositions

One general class of embodiments provides nanocomposites that can have a high dielectric constant as well as compositions for making such nanocomposites. The composite materials comprise ferroelectric nanowires or nanoparticles. The composites have a number of uses. For example, they can be formed into thin insulating films, such as those printed on circuit boards. In addition, the nanocomposites can be used in data storage media, where information is encoded by flipping the ferroelectric state of individual nanowires or nanoparticles to write bits.

Nanocomposites

The composite materials of this embodiment comprise one or more ferroelectric nanowires or one or more ferroelectric nanoparticles and a small molecule or molecular matrix or a matrix comprising one or more polymers. The nanowires or nanoparticles can comprise essentially any convenient ferroelectric or ferroelectric ceramic material. For example, the nanowires or nanoparticles can comprise a perovskite-type material (including but not limited to $BaTiO_3$, $SrTiO_3$, $CaTiO_3$, $KNbO_3$, $PbTiO_3$, $LiTiO_3$, $LiTaO_3$, or $LiNbO_3$, or a material derived from these, for example, $Ba_{(1-x)}Ca_xTiO_3$ where x is between 0 and 1, or $PbTi_{(1-x)}Zr_xO_3$ where x is between 0 and 1); a KDP-type material (e.g., $KH_2PO_4$, $KD_2PO_4$, $RbH_2PO_4$, $RbH_2AsO_4$, $KH_2AsO_4$, or GeTe, or a material derived from these); a TGS-type material (e.g., tri-glycine sulfate, tri-glycine selenate, or a material derived from these); or a mixture thereof.

The diameter of the nanowires can be varied. For example, the average diameter of the nanowires can be preferably between about 2 nm and about 100 nm, or more preferably between about 2 nm and about 5 nm or between about 10 nm and about 50 nm. The length of the nanowires can also be varied. In certain embodiments, the nanowires have an aspect ratio between about 1.5 and about 10,000 (e.g., between about 1.5 and about 10, between about 10 and about 20, between about 20 and about 50, between about 50 and about 10,000, or between about 100 and about 10,000).

The size of the nanoparticles can also be varied. In a preferred embodiment, the one or more ferroelectric nanoparticles have an average diameter less than about 200 nm (e.g., less than about 100 nm, or less than about 50 nm). In another embodiment, the nanoparticles are roughly spherical, having an aspect ratio between about 0.9 and about 1.2.

A wide variety of polymers are known to those of skill in art and can be used in this invention. For example, the composite can comprise an inorganic polymer (e.g. a polysiloxane, a polycarbonessiloxane (a copolymer of siloxane and carborane), or a polyphosphazene) or an organometallic polymer (e.g., a ferrocene polymer, a platinum polymer, or a palladium polymer). For other examples of inorganic and organometallic polymers see e.g. Ronald Archer *Inorganic and Organometallic Polymers*. As another example, the composite can comprise an organic polymer, e.g., a thermoplastic polymer (e.g., a polyolefin, a polyester, a polysilicone, a polyacrylonitrile resin, a polystyrene resin, polyvinyl chloride, polyvinylidene chloride, polyvinyl acetate, or a fluoroplastic), a thermosetting polymer (e.g., a phenolic resin, a urea resin, a melamine resin, an epoxy resin, a polyurethane resin, an engineering plastic, a polyamide, a polyacrylate resin, a polyketone, a polyimide, a polysulfone, a polycarbonate, or a polyacetal), or a liquid crystal polymer, including a main chain liquid crystal polymer (e.g., poly (hydroxynapthoic acid) or a side chain liquid crystal polymer (e.g., poly <n-((4'(4"-cyanphenyl)phenoxy)alkyl)vinyl ether>). For other examples see e.g., Dietrich Demus, John W. Goodby, George W. Gray, Hans W. Spiess, and Volkmar Vill (1998) *Handbook of Liquid Crystals, Handbook of Liquid Crystals: Four Volume Set*, John Wiley and Sons, Inc.; Johannes Brandrup (1999) Polymer Handbook, John Wiley and Sons, Inc.; and Charles A. Harper (2002) Handbook of Plastics, Elastomers, and Composites, $4^{th}$ edition, McGraw-Hill; and T. A. Skatherin (ed.) *Handbook of Conducting Polymers I*. Alternatively, the composite can comprise a small molecule or molecular matrix. A variety of such matrices are known in the art, comprising e.g., molecular organics such as those used in OLEDs; N,N'-diphenyl-N, N'-bis(3-methylphenyl)-(1,1'biphenyl)-4,4'-diamine)(TPD); (3-(4-biphenyl)-4-phenyl-5-tert-butylphenyl-1,2,4-triazole) (TAZ); tris-(8-hydroxyquinoline)aluminum($Alq_3$); benzoic acid; phthalic acid; benzoin; hydroxyphenol; nitrophenol; chlorophenol; chloroaniline; or chlorobenzoamide. Preferred small molecules have at least one polar functional group and have a high enough melting point that they are solid at room temperature.

The polymeric or small molecule or molecular matrix can optionally comprise one or more additives. An additive can be used, for example, to assist in forming the composite. Examples include a catalyst used to cross-link a polymeric matrix or a surfactant used to disperse nanowires or nanoparticles throughout the matrix. As another example, an additive can be used to affect one or more physical properties of the matrix and/or the composite, e.g., the additive can be a plasticizer, a strengthening fiber, or an antioxidant.

The dielectric constant of the composite material can be controlled by varying the amount of nanowires or nanoparticles added to the composite. Typically, the composite comprises nanowires or nanoparticles in an amount greater than 0% and less than about 90% by volume (e.g., greater than about 0% to less than about 40% by volume, greater than about 0.5% to less than about 25% by volume, greater than about 1% to less than about 15% by volume, or greater than about 15% to about 40% by volume). In a preferred embodiment, the ferroelectric nanowires or nanoparticles are included in sufficient quantity that the composite has a dielectric constant of at least about 2, more preferably at least about 5, or most preferably at least about 10.

The composite can be formed into a film (e.g., an insulating film applied over a microelectronic device), a sheet, or other useful shape. Similarly, the composite material can be applied to a substrate (e.g., a circuit board). The substrate can comprise, for example, silicon, glass, an oxide, a metal, or a plastic.

The composite material can also be incorporated into compositions. One embodiment provides a composition comprising particles of the composite material, at least one solvent, and at least one glue agent. The glue agent can be any substance capable of sticking the particles of the composite material together; for example, a polymer or a cross-linker. The particles of the composite material typically have an average diameter between about 20 nm and about 20 micrometers (e.g., between about 100 nm and about 20 micrometers), but can be smaller or larger. The composition can be used to form a nanocomposite film, for example, after application to a substrate. The at least one solvent can be essentially any convenient solvent, for example, water or an organic solvent (e.g., an alcohol, a ketone, an acetate, an amine, a diol, a glycol, or a glycol ether). The solvent concentration can be adjusted to adjust the viscosity of the composition to render it suitable for application to essentially any desired substrate by any convenient method (e.g., inkjet printing, screen printing, brushing, or spraying). The composition can optionally comprise one or more additives, for example, a surfactant to assist in dispersal of the particles of the composite material or a humectant. The particles of the composite material can be formed according to methods known in the art, e.g., by grinding a solid composite, or e.g. by spray drying a suspension of a composition as described below.

Compositions

Two classes of embodiments provide compositions that can be used to form nanocomposites. For example, the compositions can be applied to a substrate to form a nanocomposite film on the substrate.

One class of embodiments provides a composition that comprises one or more ferroelectric nanowires or one or more ferroelectric nanoparticles, at least one solvent, and one or more polymers. The nanowires or nanoparticles can comprise essentially any convenient ferroelectric or ferroelectric ceramic material. For example, the nanowires or nanoparticles can comprise a perovskite-type material (including but not limited to $BaTiO_3$, $SrTiO_3$, $CaTiO_3$, $KNbO_3$, $PbTiO_3$, $LiTiO_3$, $LiTaO_3$, or $LiNbO_3$, or a material derived from these, for example, $Ba_{(1-x)}Ca_xTiO_3$ where x is between 0 and 1, or $PbTi_{(1-x)}Zr_xO_3$ where x is between 0 and 1); a KDP-type material (e.g., $KH_2PO_4$, $KD_2PO_4$, $RbH_2PO_4$, $RbH_2AsO_4$, $KH_2AsO_4$, or GeTe, or a material derived from these); a TGS-type material (e.g., tri-glycine sulfate, tri-glycine selenate, or a material derived from these); or a mixture thereof.

The diameter of the nanowires can be varied. For example, the average diameter of the nanowires can be preferably between about 2 nm and about 100 nm, or more preferably between about 2 nm and about 5 nm or between about 10 nm and about 50 nm. The length of the nanowires can also be varied. In certain embodiments, the nanowires have an aspect ratio between about 1.5 and about 10,000 (e.g., between about 1.5 and about 10, between about 10 and about 20, between about 20 and about 50, between about 50 and about 10,000, or between about 100 and about 10,000).

The size and shape of the nanoparticles can also be varied. For example, the one or more ferroelectric nanoparticles can have an average diameter less than about 200 nm (e.g., less than about 100 nm, or less than about 50 nm), and/or the nanoparticles can be roughly spherical, having an aspect ratio between about 0.9 and about 1.2.

A wide variety of polymers are known to those of skill in the art and can be used in this invention. For example, the composition can comprise an inorganic polymer (e.g. a polysiloxane, a polycarbonessiloxane (a copolymer of siloxane and carborane), or a polyphosphazene) or an organometallic polymer (e.g., a ferrocene polymer, a platinum polymer, or a palladium polymer); see also e.g. Ronald Archer *Inorganic and Organometallic Polymers*. As another example, the composite can comprise an organic polymer, e.g., a thermoplastic polymer (e.g., a polyolefin, a polyester, a polysilicone, a polyacrylonitrile resin, a polystyrene resin, polyvinyl chloride, polyvinylidene chloride, polyvinyl acetate, or a fluoroplastic), a thermosetting polymer (e.g., a phenolic resin, a urea resin, a melamine resin, an epoxy resin, a polyurethane resin, an engineering plastic, a polyamide, a polyacrylate resin, a polyketone, a polyimide, a polysulfone, a polycarbonate, or a polyacetal), or a liquid crystal polymer, including a main chain liquid crystal polymer (e.g., poly(hydroxynapthoic acid) or a side chain liquid crystal polymer (e.g., poly <n-((4'(4"-cyanphenyl)phenoxy) alkyl)vinyl ether>). For other examples see e.g., Dietrich Demus, John W. Goodby, George W. Gray, Hans W. Spiess, and Volkmar Vill (1998) *Handbook of Liquid Crystals, Handbook of Liquid Crystals: Four Volume Set*, John Wiley and Sons, Inc.; Johannes Brandrup (1999) Polymer Handbook, John Wiley and Sons, Inc.; and Charles A. Harper (2002) Handbook of Plastics, Elastomers, and Composites, $4^{th}$ edition, McGraw-Hill; and T. A. Skatherin (ed.) *Handbook of Conducting Polymers I*.

The one or more polymers can be provided in various forms. For example, in one embodiment, the polymer(s) are soluble in the at least one solvent (e.g., polyacrylic acid in water, or PVDF in acetone). In another embodiment, the polymer(s) comprise oligomers that are soluble in the solvent. In this embodiment, the composition can further comprise at least one cross-linking agent (e.g., a cross-linker and/or a catalyst, for cross-linking the oligomers after the composition has been applied to a surface). For example, the composition could comprise dimethylsiloxane oligomers, siloxane cross-linkers (which are also oligomers), and a catalyst, such that application and curing of the composition results in a PDMS matrix comprising ferroelectric nanowires or nanoparticles. In yet another embodiment, the polymer(s) comprise emulsion polymerized polymer particles that are dispersed in the at least one solvent. In this embodiment, the composition can further comprise at least one glue agent, for example, a polymer or cross-linking agent. Emulsion polymerized particles of various polymers are commercially available; for example, emulsions of polyolefins and polyacrylates are available from Air Products and Chemicals, Inc. (www.airproducts.com). The size of available polymer particles is typically in the range of about 10 nm to about 200 nm.

The composition can optionally further comprise at least one surfactant (e.g., a cationic, anionic, or nonionic surfactant) and/or at least one humectant (e.g., a glycol, a diol, a sulfoxide, a sulfone, an amide, or an alcohol).

The at least one solvent can be essentially any convenient solvent, for example, water or an organic solvent (e.g., an alcohol, a ketone, an acetate, an amine, a diol, a glycol, or a glycol ether). The solvent concentration can be adjusted to control the consistency of the composition. For example, the composition can be a liquid suitable for use as an inkjet printing ink or can be a paste suitable for use as a screen printing ink. For example, the composition can have a consistency that makes it suitable for applying it to a surface by brushing or spraying.

The composition can be used to form a film. For example, after application to a substrate, the composition can form a nanocomposite film. The composition can be applied to essentially any desired substrate, for example a substrate that comprises silicon, glass, an oxide, a metal, or a plastic.

Another class of embodiments provides a composite that comprises one or more ferroelectric nanowires or one or more ferroelectric nanoparticles and at least one monomeric precursor of at least one polymer. The nanowires or nanoparticles can comprise essentially any convenient ferroelectric or ferroelectric ceramic material. For example, the nanowires or nanoparticles can comprise a perovskite-type material (including but not limited to $BaTiO_3$, $SrTiO_3$, $CaTiO_3$, $KNbO_3$, $PbTiO_3$, $LiTiO_3$, $LiTaO_3$, or $LiNbO_3$, or a material derived from these, for example, $Ba_{(1-x)}Ca_xTiO_3$ where x is between 0 and 1, or $PbTi_{(1-x)}Zr_xO_3$ where x is between 0 and 1); a KDP-type material (e.g., $KH_2PO_4$, $KD_2PO_4$, $RbH_2PO_4$, $RbH_2AsO_4$, $KH_2AsO_4$, or GeTe, or a material derived from these); a TGS-type material (e.g., tri-glycine sulfate, tri-glycine selenate, or a material derived from these); or a mixture thereof.

The diameter of the nanowires can be varied. For example, the average diameter of the nanowires can be preferably between about 2 nm and about 100 nm, or more preferably between about 2 nm and about 5 nm or between about 10 nm and about 50 nm. The length of the nanowires can also be varied. In certain embodiments, the nanowires have an aspect ratio between about 1.5 and about 10,000 (e.g., between about 1.5 and about 10, between about 10 and about 20, between about 20 and about 50, between about 50 and about 10,000, or between about 100 and about 10,000).

The size and shape of the nanoparticles can also be varied. For example, the one or more ferroelectric nanoparticles can have an average diameter less than about 200 nm (e.g., less than about 100 nm, or less than about 50 nm), and/or the nanoparticles can be roughly spherical, having an aspect ratio between about 0.9 and about 1.2.

The at least one monomeric precursor can comprise a monomer of essentially any polymer known to one of skill, e.g., the organic and inorganic polymers discussed herein. The polymer is preferably nonconductive. Some specific examples include e.g., styrene, acrylate, acrylonitrile, acrylamide, acrylic acid, and vinyl acetate.

The composition can further comprise at least one catalyst to catalyze polymerization of the monomers and/or at least one solvent whose concentration can be adjusted to adjust the consistency of the composition to suit various application techniques (e.g., water or an organic solvent). The composition can also further comprise at least one surfactant and/or at least one humectant.

The composition can be used to form a film. For example, after application to a substrate and polymerization, the composition can form a nanocomposite film. The composition can be applied to essentially any desired substrate, for example a substrate that comprises silicon, glass, an oxide, a metal, or a plastic.

Methods for Making Composites and Compositions

One aspect of the invention provides methods for making the composite materials and compositions described herein. All the methods involve combining preformed nanostructures with one or more other materials to form the composite or composition.

One method for making a composite material comprises preparing one or more ferroelectric nanowires or nanoparticles and combining the preformed nanowires or nanoparticles with at least one polymer or the precursors or constituents of a small molecule or molecular matrix. Components of the composite can be varied as described above. For example, the ferroelectric nanowires or nanoparticles can comprise essentially any convenient ferroelectric or ferroelectric ceramic material, e.g., a perovskite-type material (including but not limited to $BaTiO_3$, $SrTiO_3$, $CaTiO_3$, $KNbO_3$, $PbTiO_3$, $LiTiO_3$, $LiTaO_3$, or $LiNbO_3$, or a material derived from these, for example, $Ba_{(1-x)}Ca_xTiO_3$ where x is between 0 and 1, or $PbTi_{(1-x)}Zr_xO_3$ where x is between 0 and 1); a KDP-type material (e.g., $KH_2PO_4$, $KD_2PO_4$, $RbH_2PO_4$, $RbH_2AsO_4$, $KH_2AsO_4$, or GeTe, or a material derived from these); a TGS-type material (e.g., tri-glycine sulfate, tri-glycine selenate, or a material derived from these); or a mixture thereof. Typically, the composite comprises nanowires or nanoparticles in an amount greater than 0% and less than about 90% by volume (e.g., greater than about 0% to less than about 40% by volume, greater than about 0.5% to less than about 25% by volume, or greater than 1% to less than about 15% by volume). In a preferred embodiment, the ferroelectric nanowires or nanoparticles are included in sufficient quantity that the composite has a dielectric constant of at least about 2, more preferably at least about 5, or most preferably at least about 10. The at least one polymer can comprise e.g. an inorganic polymer (e.g., a polysiloxane, a polycarbonessiloxane, or a polyphosphazene), an organometallic polymer (e.g., a ferrocene polymer, a platinum polymer, or a palladium polymer), or an organic polymer, e.g., a thermoplastic polymer (e.g., a polyolefin, a polyester, a polysilicone, a polyacrylonitrile resin, a polystyrene resin, polyvinyl chloride, polyvinylidene chloride, polyvinyl acetate, or a fluoroplastic), a thermosetting polymer (e.g., a phenolic resin, a urea resin, a melamine resin, an epoxy resin, a polyurethane resin, an engineering plastic, a polyamide, a polyacrylate resin, a polyketone, a polyimide, a polysulfone, a polycarbonate, or a polyacetal), or a liquid crystal polymer, including a main chain liquid crystal polymer (e.g., poly(hydroxynapthoic acid) or a side chain liquid crystal polymer (e.g., poly <n-((4'(4"-cyanphenyl)phenoxy)alkyl)vinyl ether>). The nanowires or nanoparticles and a polymer can be combined with one or more additives, for example, a surfactant, a catalyst, a plasticizer, an antioxidant, or a strengthening fiber.

Another method for making a composite material comprises preparing one or more branched nanowires or one or more inorganic semiconducting or ferroelectric nanowires having an aspect ratio greater than about 10 (e.g., greater than about 15, greater than about 20, or greater than about 50). The preformed branched nanowires or inorganic nanowires (or a combination thereof) are then combined with at least one organic polymer or inorganic glass or the precursors or constituents of a small molecule or molecular matrix to produce a nanocomposite. Components of the composite can be varied as described above.

Another method for making a composite material comprises preparing one or more nanostructures and incorporating the preformed nanostructures into a polymeric matrix comprising polysiloxane (e.g., polydimethylsiloxane). Components of the composite can be varied as described above.

A method for making a composition comprises preparing particles of a composite material, where the composite comprises ferroelectric nanowires or nanoparticles and a small molecule or molecular matrix or matrix comprising one or more polymers, and combining the composite particles with at least one solvent and at least one glue agent. Components of the composition can be varied as described above.

Another method of making a composition comprises preparing one or more ferroelectric nanowires or nanoparticles and combining them with at least one solvent and one or more polymers. The one or more polymers can take various forms. For example, the polymer(s) can be soluble in the solvent, comprise oligomers soluble in the solvent, or comprise emulsion polymerized particles capable of being suspended in the solvent. Components of the composition can be varied as described above.

Another method of making a composition comprises preparing one or more ferroelectric nanowires or nanoparticles and combining them with at least one monomeric precursor of at least one polymer. Components of the composition can be varied as described above.

General Considerations

Composite materials comprising nanostructures can be made according to methods known in the art. See, e.g., Dufresne et al. (1996) "New nanocomposite materials: Microcrystalline starch reinforced thermoplastic" *Macromolecules* 29, 7624–7626; and Angles et al. (2001) "Plasticized starch/tunicin whiskers nanocomposite materials. 2. Mechanical behavior" *Macromolecules* 34, 2921–2931. For example, a nanocomposite can be formed by dispersing nanostructures in a solution comprising components of the matrix (e.g., a small molecule, a monomer, an oligomer, a polymer dissolved in a solvent, a polymer emulsion, a copolymer, or a combination thereof) and optionally an additive (e.g., a surfactant, a catalyst, a strengthening fiber, a plasticizer, or an antioxidant) by agitation (e.g., ultrasonication or mechanical stirring) and then if necessary removing any excess solvent. The nanocomposite can e.g. be applied to a surface (e.g., by spin casting) prior to removal of any excess solvent. As another example, small molecule matrices can be created using a combination of e.g. evaporative, spray coating, or spin-coating processes. The evaporation of small molecules and condensation onto a substrate allows for finely controlled deposition and the design of complex layered structures.

Synthesis of Nanostructures

Nanostructures can be fabricated and their size can be controlled by any of a number of convenient methods that can be adapted to different materials. For example, synthesis of nanocrystals of various composition is described in, e.g., Peng et al. (2000) "Shape control of CdSe nanocrystals" *Nature* 404, 59–61; Puntes et al. (2001) "Colloidal nanocrystal shape and size control: The case of cobalt" *Science* 291, 2115–2117; U.S. Pat. No. 6,306,736 to Alivisatos et al. (Oct. 23, 2001) entitled "Process for forming shaped group III-V semiconductor nanocrystals, and product formed using process"; U.S. Pat. No. 6,225,198 to Alivisatos et al. (May 1, 2001) entitled "Process for forming shaped group II-VI semiconductor nanocrystals, and product formed using process"; U.S. Pat. No. 5,505,928 to Alivisatos et al. (Apr. 9, 1996) entitled "Preparation of III-V semiconductor nanocrystals"; U.S. Pat. No. 5,751,018 to Alivisatos et al. (May 12, 1998) entitled "Semiconductor nanocrystals covalently bound to solid inorganic surfaces using self-assembled monolayers"; U.S. Pat. No. 6,048,616 to Gallagher et al. (Apr. 11, 2000) entitled "Encapsulated quantum sized doped semiconductor particles and method of manufacturing same"; and U.S. Pat. No. 5,990,479 to Weiss et al. (Nov. 23, 1999) entitled "Organo luminescent semiconductor nanocrystal probes for biological applications and process for making and using such probes."

Growth of nanowires having various aspect ratios, including nanowires with controlled diameters, is described in, e.g., Gudiksen et al (2000) "Diameter-selective synthesis of semiconductor nanowires" *J. Am. Chem. Soc.* 122, 8801–8802; Cui et al. (2001) "Diameter-controlled synthesis of single-crystal silicon nanowires" *Appl. Phys. Lett.* 78, 2214–2216; Gudiksen et al. (2001) "Synthetic control of the diameter and length of single crystal semiconductor nanowires" *J. Phys. Chem. B* 105,4062–4064; Morales et al. (1998) "A laser ablation method for the synthesis of crystalline semiconductor nanowires" *Science* 279, 208–211; Duan et al. (2000) "General synthesis of compound semiconductor nanowires" *Adv. Mater.* 12, 298–302; Cui et al. (2000) "Doping and electrical transport in silicon nanowires" *J. Phys. Chem. B* 104, 5213–5216; Peng et al. (2000) "Shape control of CdSe nanocrystals" *Nature* 404, 59–61; Puntes et al. (2001) "Colloidal nanocrystal shape and size control: The case of cobalt" *Science* 291, 2115–2117; U.S. Pat. No. 6,306,736 to Alivisatos et al. (Oct. 23, 2001) entitled "Process for forming shaped group III-V semiconductor nanocrystals, and product formed using process"; U.S. Pat. No. 6,225,198 to Alivisatos et al. (May 1, 2001) entitled "Process for forming shaped group II-VI semiconductor nanocrystals, and product formed using process"; U.S. Pat. No. 6,036,774 to Lieber et al. (Mar. 14, 2000) entitled "Method of producing metal oxide nanorods"; U.S. Pat. No. 5,897,945 to Lieber et al. (Apr. 27, 1999) entitled "Metal oxide nanorods"; U.S. Pat. No. 5,997,832 to Lieber et al. (Dec. 7, 1999) "Preparation of carbide nanorods"; Urbau et al. (2002) "Synthesis of single-crystalline perovskite nanowires composed of barium titanate and strontium titanate" *J. Am. Chem. Soc.*, 124, 1186; and Yun et al. (2002) "Ferroelectric Properties of Individual Barium Titanate Nanowires Investigated by Scanned Probe Microscopy" *Nanoletters* 2, 447.

Growth of branched nanowires (e.g., nanotetrapods, tripods, bipods, and branched tetrapods) is described in, e.g., Jun et al. (2001) "Controlled synthesis of multi-armed CdS nanorod architectures using monosurfactant system" *J. Am. Chem. Soc.* 123, 5150–5151; and Manna et al. (2000) "Synthesis of Soluble and Processable Rod-, Arrow-, Teardrop-, and Tetrapod-Shaped CdSe Nanocrystals" *J. Am. Chem. Soc.* 122, 12700–12706.

Synthesis of nanoparticles is described in, e.g., U.S. Pat. No. 5,690,807 to Clark Jr. et al. (Nov. 25, 1997) entitled "Method for producing semiconductor particles"; U.S. Pat. No. 6,136,156 to El-Shall, et al. (Oct. 24, 2000) entitled "Nanoparticles of silicon oxide alloys"; U.S. Pat. No. 6,413,489 to Ying et al. (Jul. 2, 2002) entitled "Synthesis of nanometer-sized particles by reverse micelle mediated techniques"; and Liu et al. (2001) "Sol-Gel Synthesis of Free-Standing Ferroelectric Lead Zirconate Titanate Nanoparticles" *J. Am. Chem. Soc.* 123, 4344. Synthesis of nanoparticles is also described in the above citations for growth of nanocrystals, nanowires, and branched nanowires, where the resulting nanostructures have an aspect ratio less than about 1.5.

Synthesis of core-shell nanostructure heterostructures, namely nanocrystal and nanowire (e.g., nanorod) core-shell heterostructures, are described in, e.g., Peng et al. (1997) "Epitaxial growth of highly luminescent CdSe/CdS core/shell nanocrystals with photostability and electronic accessibility" *J. Am. Chem. Soc.* 119, 7019–7029; Dabbousi et al. (1997) "(CdSe)ZnS core-shell quantum dots: Synthesis and characterization of a size series of highly luminescent nanocrysallites" *J. Phys. Chem. B* 101, 9463–9475; Manna et al. (2002) "Epitaxial growth and photochemical annealing of graded CdS/ZnS shells on colloidal CdSe nanorods" *J. Am. Chem. Soc.* 124, 7136–7145; and Cao et al. (2000) "Growth and properties of semiconductor core/shell nanocrystals with InAs cores" *J. Am. Chem. Soc.* 122, 9692–9702. Similar approaches can be applied to growth of other core-shell nanostructures.

Growth of nanowire heterostructures in which the different materials are distributed at different locations along the long axis of the nanowire is described in, e.g., Gudiksen et al. (2002) "Growth of nanowire superlattice structures for nanoscale photonics and electronics" *Nature* 415, 617–620; Bjork et al. (2002) "One-dimensional steeplechase for electrons realized" *Nano Letters* 2, 86–90; Wu et al. (2002) "Block-by-block growth of single-crystalline Si/SiGe superlattice nanowires" *Nano Letters* 2, 83–86; and U.S. patent application Ser. No. 60/370,095 (Apr. 2, 2002) to Empedocles entitled "Nanowire heterostructures for encoding information." Similar approaches can be applied to growth of other heterostructures.

In certain embodiments, the collection or population of nanostructures is substantially monodisperse in size and/or shape. See e.g., US patent application 20020,071,952 by Bawendi et al entitled "Preparation of nanocrystallites."

Nanostructures optionally comprise additional elements to enhance their function. For example, nanostructures (e.g., crystalline nanostructures) can optionally be dye sensitized to increase light absorption and/or charge injection into the nanostructure. Examples of such dyes include those described in U.S. Pat. No. 6,245,988 and published PCT Application Nos. WO 94/04497 and 95/29924, where ruthenium-based dyes are provided to enhance light absorption and charge injection.

Controlling Nanostructure Emission Spectra

As indicated previously, nanostructures can be fabricated from fluorescent materials (among many other materials). The composition, size, and shape of such a nanostructure affects its emission spectrum (the wavelength(s) of light emitted by the nanostructure). The emission spectrum of a nanostructure can thus be controlled by controlling its composition, size, and shape.

Exemplary semiconducting materials that at certain size ranges emit energy in the visible range include, but are not limited to, CdS, CdSe, CdTe, ZnSe, ZnTe, GaP, and GaAs. Semiconductor materials that can emit energy in the near-infrared range include, for example, InP, InAs, InSb, PbS, and PbSe. Semiconducting materials that can emit energy in the blue to near-ultraviolet range include, for example, ZnS and GaN.

The color of light produced by a particular size, size distribution, shape, and/or composition of a nanostructure can be readily calculated or measured by methods known to those skilled in the art. See, for example, Murray et al. (1993) *J. Am. Chem. Soc.* 115, 8706, and Li et al. (2001) "Band gap variation of size- and shape-controlled colloidal CdSe quantum rods" *Nanoletters* 1, 349–351.

Fluorescent nanostructures can each be a single material or a heterostructure, in which case both (or all) of the multiple materials comprising the nanostructure can affect emission. For example, a shell can be chosen to enhance the efficiency of emission by the core, by mitigating adverse effects caused by defects at the surface of the nanostructure that can result in traps for electrons or holes that degrade the electrical and optical properties of the material. An insulating layer at the surface of the nanostructure can provide an atomically abrupt jump in the chemical potential at the interface that eliminates energy states that can serve as traps for the electrons and holes. This results in higher efficiency in the luminescent process.

Suitable materials for a fluorescence efficiency-enhancing shell include e.g. materials having a higher band gap energy than the material forming the nanostructure's core. In addition to having a band gap energy greater than that of the core material, suitable materials for the shell can have e.g. good conduction and valence band offset with respect to the core material. That is, the conduction band is preferably higher and the valence band is preferably lower than those of the core material. For cores that emit energy in the visible range (e.g., CdS, CdSe, CdTe, ZnSe, ZnTe, GaP, GaAs) or near-infrared (e.g., InP, InAs, InSb, PbS, PbSe), a material that has a band gap energy e.g. in the ultraviolet range can be used (e.g., ZnS, GaN, and magnesium chalcogenides, e.g., MgS, MgSe, and MgTe). For a core that emits in the near-infrared, materials having a band gap energy e.g. in the visible range (e.g. CdS or CdSe) can also be used.

Similar considerations can apply when choosing materials for other types of heterostructures (e.g., in a nanowire heterostructure where the different materials are distributed at different locations along the long axis of the nanowire). For example, higher band gap energy regions bounding a lower band gap energy region within such a nanowire heterostructure can improve fluorescence emission intensity, just as a shell or shells can improve emission by the core in a core-shell heterostructure.

While the foregoing invention has been described in some detail for purposes of clarity and understanding, it will be clear to one skilled in the art from a reading of this disclosure that various changes in form and detail can be made without departing from the true scope of the invention. For example, all the techniques, methods, compositions, and apparatus described above can be used in various combinations. All publications, patents, patent applications, and/or other documents cited in this application are incorporated by reference in their entirety for all purposes to the same extent as if each individual publication, patent, patent application, and/or other document were individually indicated to be incorporated by reference for all purposes.

What is claimed is:

1. A composite material, comprising:
    a matrix; and
    one or more nanostructures, the one or more nanostructures each comprising a core and at least one shell, the core comprising a first semiconducting material having a conduction band and a valence band, the shell comprising a second semiconducting material having a conduction band and a valence band, and the first and second materials having a type II band offset.

2. A composite material as in claim 1, wherein the conduction band of the first material is lower than the conduction band of the second material, and the valence band of the first material is lower than the valence band of the second material.

3. A composite material as in claim 1, wherein the conduction band of the first material is higher than the conduction band of the second material, and the valence band of the first material is higher than the valence band of the second material.

4. A composite material as in claim 1, wherein the matrix comprises at least one polymer, comprises at least one glass, or is a small molecule or molecular matrix.

5. A composite material as in claim 1, wherein the matrix conducts both electrons and holes, conducts substantially only holes, conducts substantially only electrons, is semiconducting, or is substantially nonconductive.

6. A composite material as in claim 1, wherein the one or more nanostructures comprise one or more of: nanocrystals, nanowires, branched nanowires, or nanotetrapods.

* * * * *

UNITED STATES PATENT AND TRADEMARK OFFICE
CERTIFICATE OF CORRECTION

PATENT NO. : 7,068,898 B2 Page 1 of 1
APPLICATION NO. : 10/656916
DATED : June 27, 2006
INVENTOR(S) : Buretea et al.

It is certified that error appears in the above-identified patent and that said Letters Patent is hereby corrected as shown below:

On the title page (75):
should read

-- Inventors: Mihai Buretea, San Francisco, CA (US); Stephen Empedocles, Mountain View, CA (US); Erik C. Scher, San Francisco, CA (US) --

Signed and Sealed this

Fourth Day of September, 2007

JON W. DUDAS
*Director of the United States Patent and Trademark Office*